United States Patent
Caron et al.

(10) Patent No.: US 11,177,787 B2
(45) Date of Patent: Nov. 16, 2021

(54) LAMB WAVE RESONATOR AND OTHER TYPE OF ACOUSTIC WAVE RESONATOR INCLUDED IN ONE OR MORE FILTERS

(71) Applicant: Skyworks Solutions, Inc., Irvine, CA (US)

(72) Inventors: Joshua James Caron, Madison, NC (US); Toru Jibu, Irvine, CA (US); Benjamin Paul Abbott, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 218 days.

(21) Appl. No.: 16/287,909

(22) Filed: Feb. 27, 2019

(65) Prior Publication Data

US 2019/0273479 A1    Sep. 5, 2019

Related U.S. Application Data

(60) Provisional application No. 62/637,641, filed on Mar. 2, 2018.

(51) Int. Cl.
  *H03H 9/02*  (2006.01)
  *H03H 9/56*  (2006.01)
  (Continued)

(52) U.S. Cl.
  CPC .... *H03H 9/02228* (2013.01); *H03H 9/02007* (2013.01); *H03H 9/02031* (2013.01);
  (Continued)

(58) Field of Classification Search
  CPC ........... H03H 9/02007; H03H 9/02031; H03H 9/02228; H03H 9/02574; H03H 9/13;
  (Continued)

(56) References Cited

U.S. PATENT DOCUMENTS 9,071,225 B2  6/2015  Nishihara et al.
9,118,303 B2  8/2015  Inoue
(Continued)

FOREIGN PATENT DOCUMENTS

CN      106053595 A      10/2016
JP    2013-223025 A   *  10/2013

OTHER PUBLICATIONS

A. Volatier et al.; "UHF?VHF Resonators Using Lamb Waves Co-Integrated with Bulk Acoustic Wave Resonators"; 2005 IEEE Ultrasonics Symposium, 2005, pp. 902-905. (Year: 2005).*

(Continued)

*Primary Examiner* — Barbara Summons
(74) *Attorney, Agent, or Firm* — Knobbe, Martens, Olson & Bear, LLP

(57) ABSTRACT

Aspects of this disclosure relate to acoustic wave filters that include a Lamb wave resonator and a second acoustic wave resonator that is a different type of acoustic wave resonator than the Lamb wave resonator. The different type of resonator can be a film bulk acoustic wave resonator for example. Some embodiments of this disclosure relate to an acoustic wave filter that includes the Lamb wave resonator and the second acoustic wave resonator. Some embodiments of this disclosure related to different respective acoustic wave filters including the Lamb wave resonator and the second acoustic wave resonator, in which the Lamb wave resonator and the second acoustic wave resonator are implemented on a common substrate.

22 Claims, 37 Drawing Sheets

(51) Int. Cl.
- *H03H 9/17* (2006.01)
- *H03H 9/70* (2006.01)
- *H03H 9/13* (2006.01)
- *H03H 9/205* (2006.01)
- *H03H 9/60* (2006.01)
- *H03H 9/58* (2006.01)
- *H01Q 1/50* (2006.01)
- *H03F 3/21* (2006.01)
- *H04B 1/40* (2015.01)
- *H03H 9/46* (2006.01)

(52) U.S. Cl.
CPC .......... *H03H 9/02574* (2013.01); *H03H 9/13* (2013.01); *H03H 9/173* (2013.01); *H03H 9/205* (2013.01); *H03H 9/564* (2013.01); *H03H 9/568* (2013.01); *H03H 9/587* (2013.01); *H03H 9/605* (2013.01); *H03H 9/706* (2013.01); *H01Q 1/50* (2013.01); *H03F 3/21* (2013.01); *H03F 2200/451* (2013.01); *H03H 9/46* (2013.01); *H04B 1/40* (2013.01)

(58) Field of Classification Search
CPC ........ H03H 9/173; H03H 9/174; H03H 9/175; H03H 9/205; H03H 9/46; H03H 9/564; H03H 9/568; H03H 9/605; H03H 9/6483; H03H 9/706; H03H 9/725; H03H 9/587; H03F 3/195; H03F 3/21; H03F 3/245; H03F 2200/451; H01Q 1/50; H04B 1/40
USPC .......................... 333/133, 193, 195, 187, 189
See application file for complete search history.

(56) References Cited

U.S. PATENT DOCUMENTS

| | | |
|---|---|---|
| 9,148,115 B2 | 9/2015 | Yabuuchi et al. |
| 9,219,467 B2 | 12/2015 | Inoue et al. |
| 9,230,745 B2 | 1/2016 | Kadota et al. |
| 9,246,533 B2 | 1/2016 | Fujiwara et al. |
| 9,385,686 B2 | 7/2016 | Nishizawa |
| 9,520,857 B2 | 12/2016 | Fujiwara et al. |
| 9,722,573 B2 | 8/2017 | Fujiwara et al. |
| 9,742,377 B2 * | 8/2017 | Iwaki ....................... H03H 9/54 |
| 10,135,422 B2 | 11/2018 | Goto et al. |
| 2006/0284703 A1 | 12/2006 | Iwasaki et al. |
| 2007/0267942 A1 | 11/2007 | Matsumoto et al. |
| 2008/0024042 A1 | 1/2008 | Isobe et al. |
| 2009/0102316 A1 | 4/2009 | Belot et al. |
| 2010/0019866 A1 * | 1/2010 | Hara ....................... H03H 9/173 |
| | | 333/191 |
| 2010/0237959 A1 | 9/2010 | Tanaka |
| 2011/0102099 A1 | 5/2011 | Shin et al. |
| 2012/0274416 A1 | 11/2012 | Hara et al. |
| 2012/0293277 A1 | 11/2012 | Hara et al. |
| 2013/0106243 A1 | 5/2013 | Reinhardt et al. |
| 2013/0271238 A1 * | 10/2013 | Onda ................... H03H 9/0571 |
| | | 333/133 |
| 2014/0009032 A1 | 1/2014 | Takhashi et al. |
| 2016/0252606 A1 | 9/2016 | Storz |
| 2017/0099043 A1 | 4/2017 | Goto et al. |
| 2017/0126206 A1 | 5/2017 | Nguyen et al. |
| 2017/0331456 A1 | 11/2017 | Ono |
| 2017/0359050 A1 * | 12/2017 | Irieda ....................... H03H 9/25 |
| 2018/0069529 A1 | 3/2018 | Bi et al. |
| 2018/0152191 A1 | 5/2018 | Niwa et al. |
| 2019/0273478 A1 * | 9/2019 | Lin ......................... H03F 3/245 |
| 2019/0273480 A1 * | 9/2019 | Lin .................... H03H 9/02228 |

OTHER PUBLICATIONS

Lin, Chih-Ming, et al., "Two-port filters and resonators on AlN/3C-SiC plates utilizing high-order Lamb wave modes," 2013 IEEE Conference on MEMS in Taipei, Taiwan, Jan. 20-24, 2013, pp. 789-792.

Yantchev, V., et al., "Thin AlN Film Resonators utilizing the Lowest order Symmetric Lamb mode: Further Developments," IEEE, Jul. 2007, pp. 1067-1072.

Zou, Jie, "High Quality Factor Lamb Wave Resonators," Electrical Engineering and Computer Sciences University of California at Berkeley, Technical Report No. UCB/EECS-2015-1, Jan. 6, 2015, 62 pages.

International Search Report dated Jun. 14, 2019 for International Patent Application No. PCT/US2019/019884, 3 pages.

Written Opinion of the International Searching Authority dated Jun. 14, 2019 for International Patent Application No. PCT/US2019/019884, 18 pages.

* cited by examiner

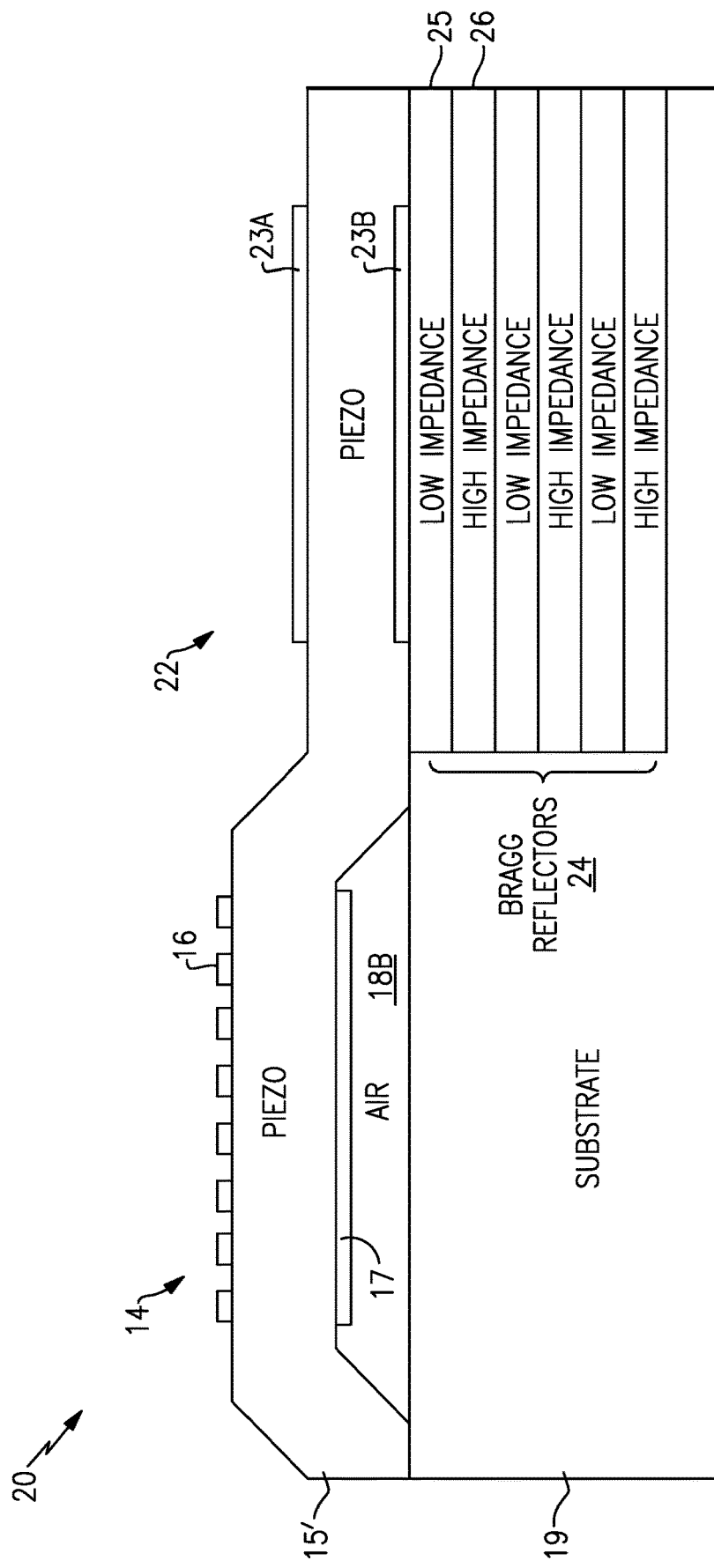

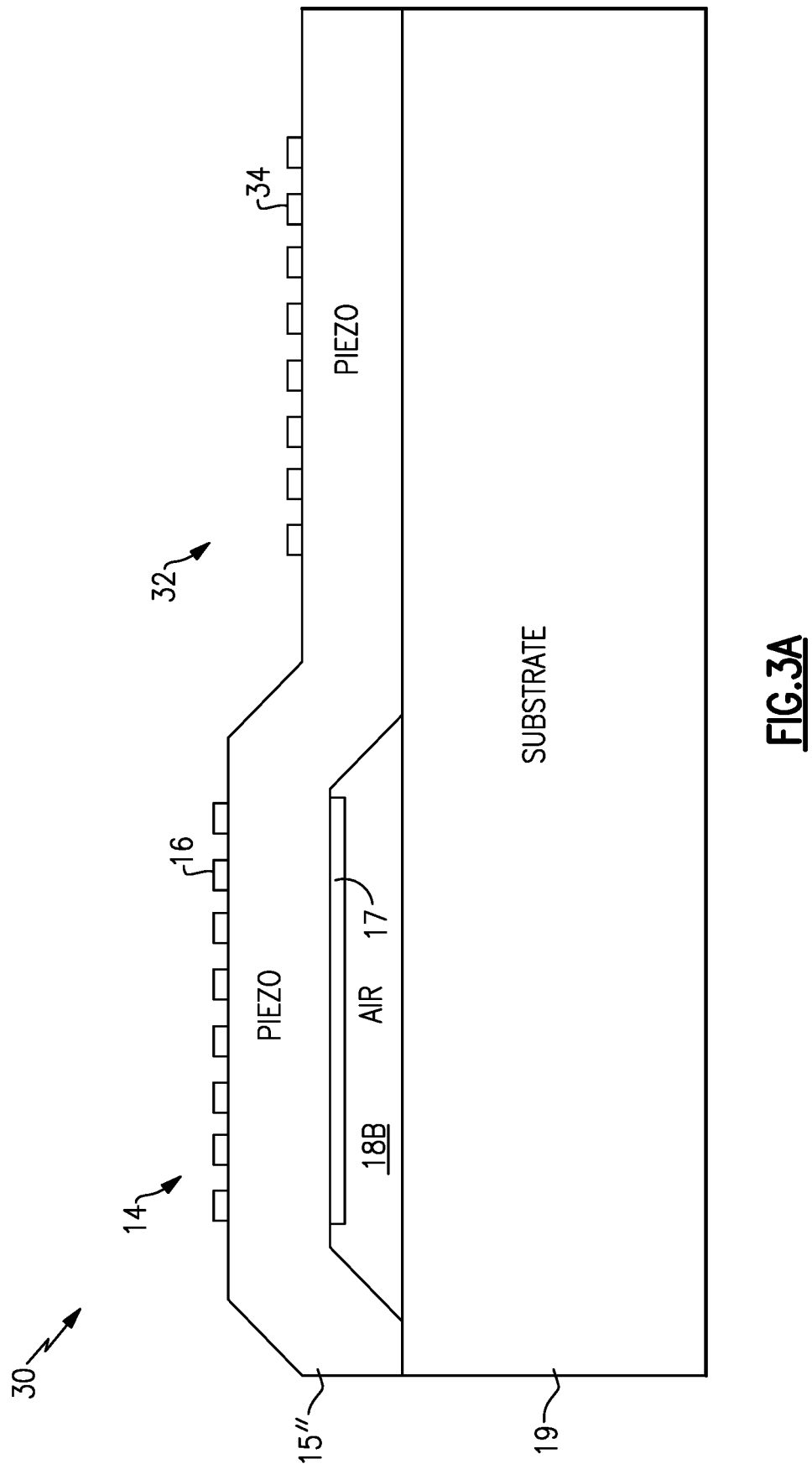

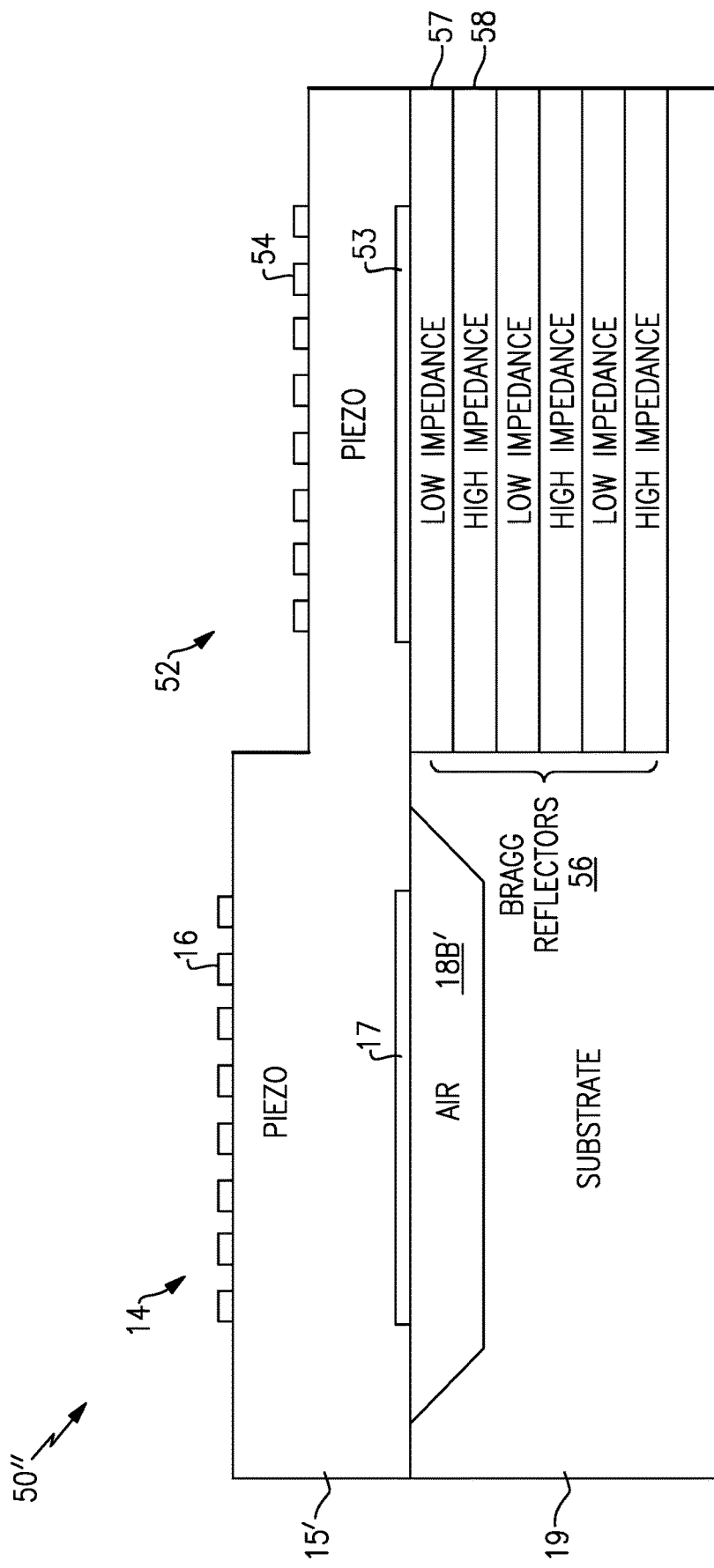

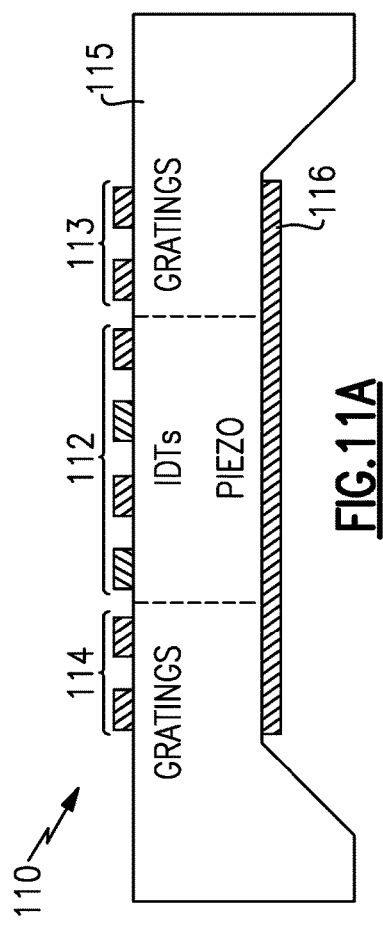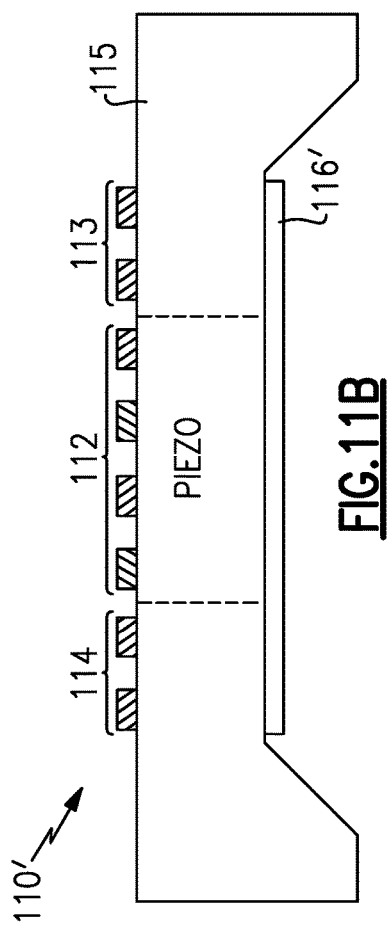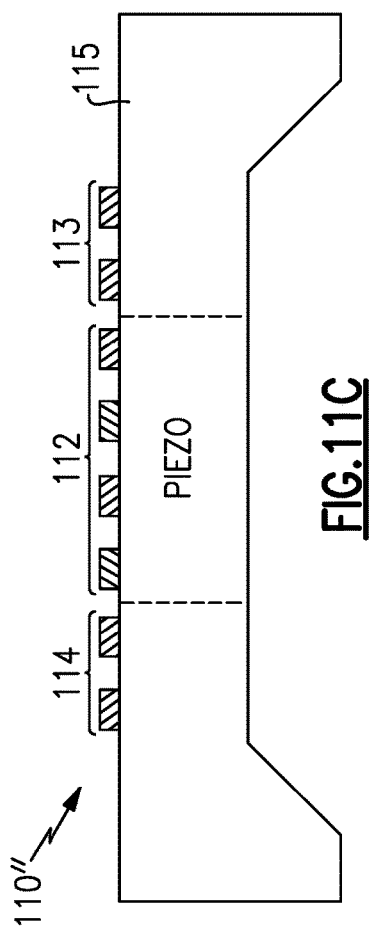

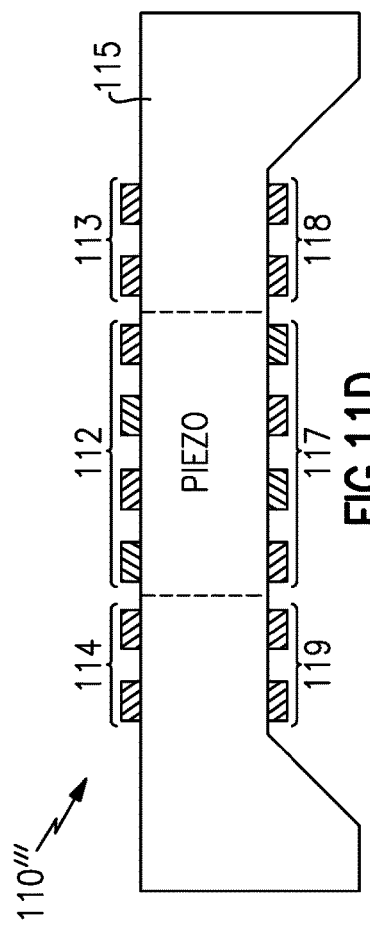
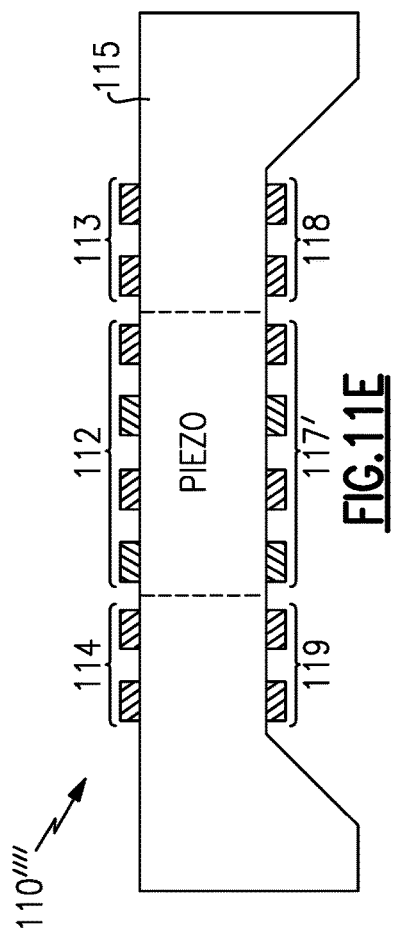
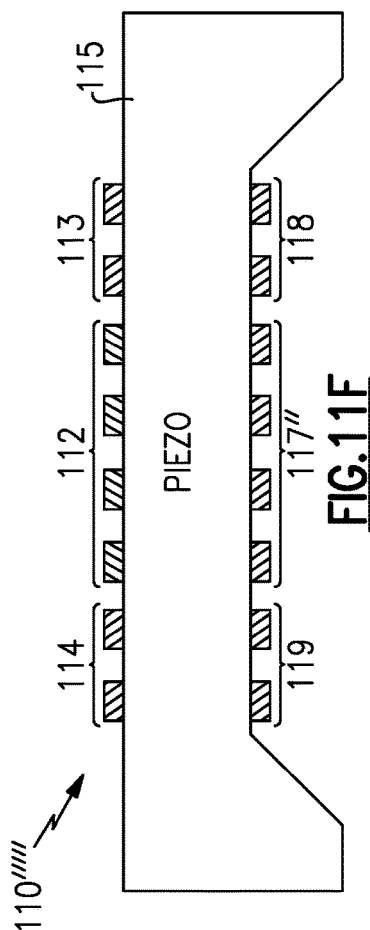

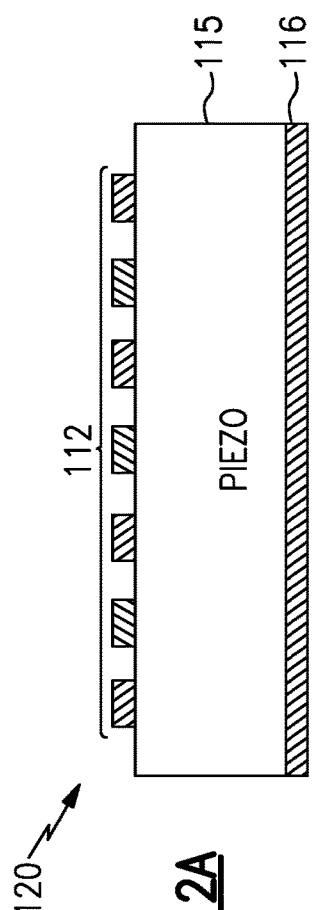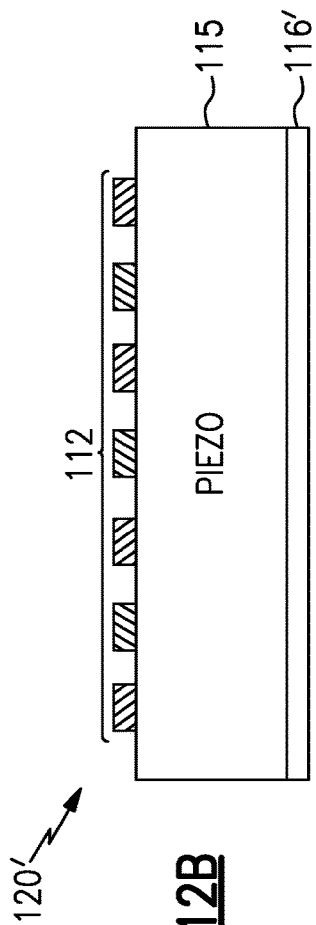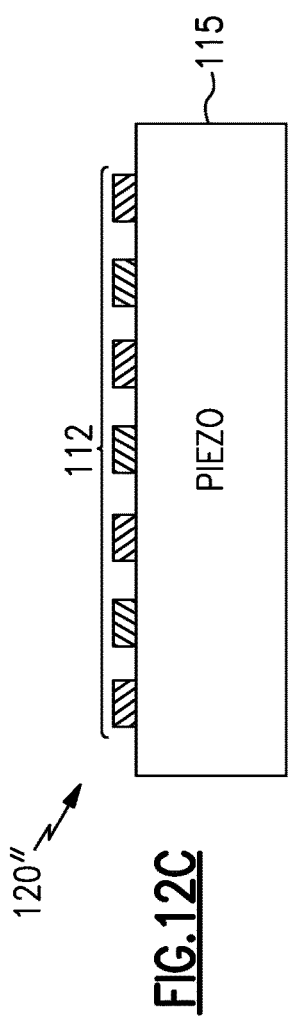

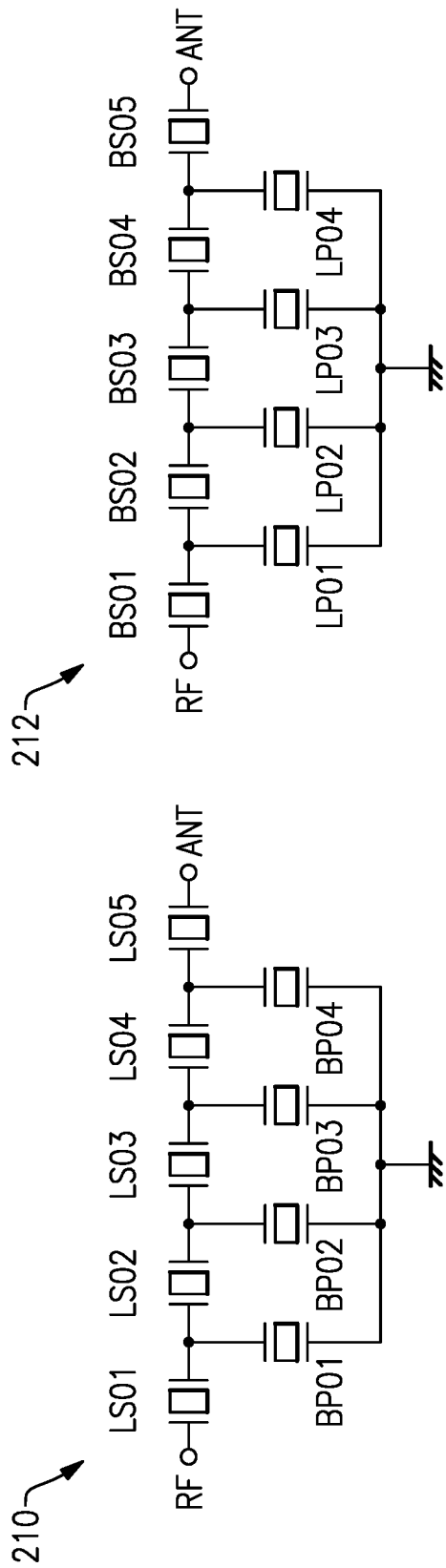

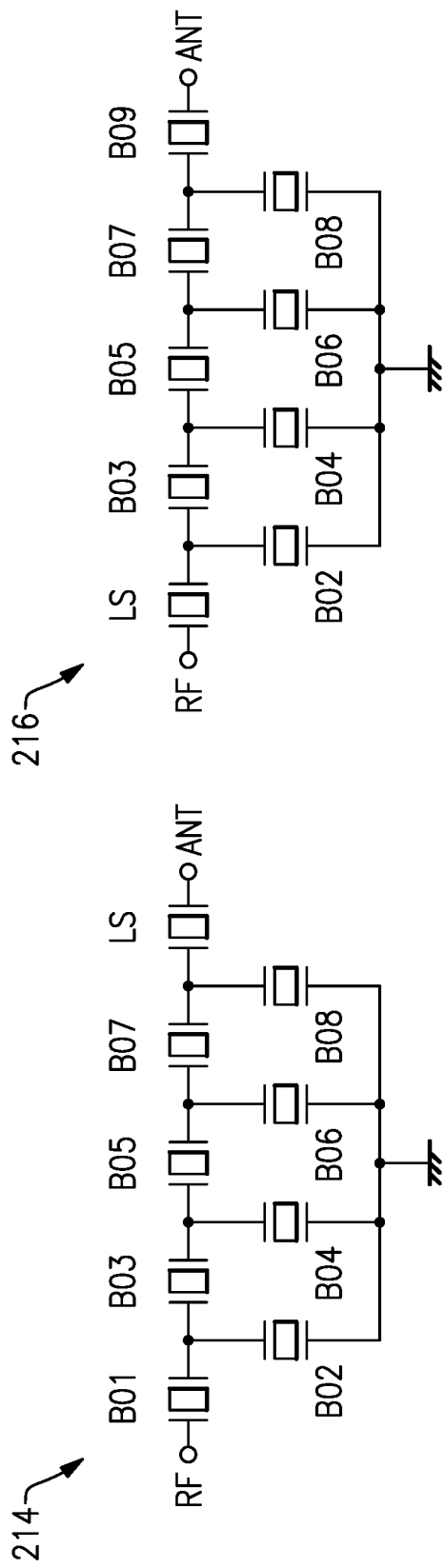

LAMB WAVE RESONATOR AND OTHER TYPE OF ACOUSTIC WAVE RESONATOR INCLUDED IN ONE OR MORE FILTERS

CROSS REFERENCE TO PRIORITY APPLICATION

This application claims the benefit of priority under 35 U.S.C. § 119(e) of U.S. Provisional Patent Application No. 62/637,641, filed Mar. 2, 2018 and titled "LAMB WAVE LOOP CIRCUIT FOR ACOUSTIC WAVE FILTER," the disclosure of which is hereby incorporated by reference in its entirety herein.

BACKGROUND

Technical Field

Embodiments of this disclosure relate to acoustic wave filters.

Description of Related Technology

Acoustic wave filters can filter radio frequency signals. An acoustic wave filter can include a plurality of resonators arranged to filter a radio frequency signal. The resonators can be arranged as a ladder circuit. Example acoustic wave filters include surface acoustic wave (SAW) filters, bulk acoustic wave (BAW) filters, and Lamb wave resonator filters. A film bulk acoustic resonator (FBAR) filter is an example of a BAW filter. A solidly mounted resonator (SMR) filter is another example of a BAW filter.

Acoustic wave filters can be implemented in radio frequency electronic systems. For instance, filters in a radio frequency front end of a mobile phone can include acoustic wave filters. Two acoustic wave filters can be arranged as a duplexer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave device that includes an acoustic wave filter configured to filter a radio frequency signal and a loop circuit coupled to the acoustic wave filter. The loop circuit is configured to generate an anti-phase signal to a target signal at a particular frequency. The loop circuit including a Lamb wave element.

The acoustic wave filter can include can include a bulk acoustic wave resonator. The bulk acoustic wave resonator and the Lamb wave element can each include the same piezoelectric material. The piezoelectric material can be aluminum nitride. The bulk acoustic wave resonator and the Lamb wave element can share a cavity. The bulk acoustic wave resonator and the Lamb wave element can have separate cavities. The bulk acoustic wave resonator can be a film bulk acoustic resonator.

The acoustic wave filter can include can include a surface acoustic wave resonator. The acoustic wave filter can include a Lamb wave resonator. The acoustic wave filter can be a receive filter. The acoustic wave filter can be a transmit filter.

The Lamb wave element can include an aluminum nitride layer. The Lamb wave element can include a lithium niobate layer. The Lamb wave element can include a lithium tantalate layer. The Lamb wave element can include an interdigital transducer electrode on a piezoelectric layer and gratings disposed on the piezoelectric layer on opposing sides of the interdigital transducer electrode. The Lamb wave element can include an interdigital transducer electrode on a piezoelectric layer, in which the interdigital transducer electrode has free edges. The Lamb wave element can operate in one or more of a lowest-order asymmetric mode, a lowest-order symmetric mode, a lowest-order shear horizontal mode, a first-order asymmetric mode, a first-order symmetric mode, or a first-order shear horizontal mode.

The Lamb wave element and at least one resonator of the acoustic wave filter can be on a common semiconductor substrate. The semiconductor substrate can be a silicon substrate.

The acoustic wave device can further include a second acoustic wave filter, in which the acoustic wave filter and the second acoustic wave filter are included in a duplexer.

Another aspect of this disclosure is a radio frequency module that includes a duplexer and a radio frequency switch. The duplexer includes an acoustic wave device. The acoustic wave device includes an acoustic wave filter and a loop circuit coupled to the acoustic wave filter. The loop circuit is configured to generate an anti-phase signal to a target signal at a particular frequency. The loop circuit includes a Lamb wave element. The radio frequency switch is arranged to pass a radio frequency signal associated with a port of the duplexer.

The acoustic wave filter can include a film bulk acoustic wave resonator. The film bulk acoustic wave resonator and the Lamb wave element can be on a common substrate. The common substrate can be a silicon substrate. The Lamb wave element can include an aluminum nitride layer.

The radio frequency module can further include a power amplifier, in which the radio frequency switch coupled in a signal path between the power amplifier and the duplexer. The radio frequency switch can be an antenna switch, and the port of the duplexer can be an antenna port coupled to the radio frequency switch.

Another aspect of this disclosure is a wireless communication device that includes a radio frequency front end and an antenna in communication with the radio frequency front end. The radio frequency front end includes an acoustic wave device. The acoustic wave device includes an acoustic wave filter configured to filter a radio frequency signal and a loop circuit coupled to the acoustic wave filter. The loop circuit configured to generate an anti-phase signal to a target signal at a particular frequency. The loop circuit includes a Lamb wave element.

The acoustic wave filter can includes a film bulk acoustic wave resonator. The film bulk acoustic wave resonator and the Lamb wave element can be on a common silicon substrate.

Another aspect of this disclosure is an acoustic wave device that includes a bulk acoustic wave resonator and a Lamb wave element. The bulk acoustic wave resonator includes a piezoelectric layer positioned between a first electrode and a second electrode. The bulk acoustic wave resonator and the Lamb wave element are implemented on a common substrate of a die.

The acoustic wave device can further include additional bulk acoustic wave resonators on the common substrate. The bulk acoustic wave resonator and the additional bulk acoustic wave resonators can be included in a band pass filter. The band pass filter can be arranged to filter a radio frequency signal. The Lamb wave element can be included in a loop circuit that is coupled to the band pass filter. The loop circuit can be configured generate an anti-phase signal to a target signal at a particular frequency.

The bulk acoustic wave resonator can be a film bulk acoustic resonator. The common substrate can include silicon. The Lamb wave element can include a piezoelectric layer that includes the same material as a piezoelectric layer of the bulk acoustic wave resonator. The material can include aluminum nitride. The bulk acoustic wave resonator and the Lamb wave element can share a cavity. The bulk acoustic wave resonator and the Lamb wave element can have separate cavities.

The bulk acoustic wave resonator can be a solidly mounted resonator. The Lamb wave element can include a Bragg reflector.

The Lamb wave element can include an interdigital transducer electrode on a piezoelectric layer and gratings disposed on the piezoelectric layer on opposing sides of the interdigital transducer electrode. The Lamb wave element can include an interdigital transducer electrode on a piezoelectric layer, in which the interdigital transducer electrode has free edges.

Another aspect of this disclosure is a radio frequency module that includes an acoustic wave device and a radio frequency switch. The acoustic wave device includes a Lamb wave element and a bulk acoustic wave resonator. The bulk acoustic wave resonator and the Lamb wave element are implemented on a common substrate of a die. The bulk acoustic wave resonator is included in a band pass filter arranged to filter a radio frequency signal. The radio frequency switch is coupled to the band pass filter. The radio frequency switch is arranged to pass the radio frequency signal.

The bulk acoustic wave resonator can be a film bulk acoustic wave resonator. The common substrate can be a silicon substrate. The Lamb wave element can include an aluminum nitride layer.

Another aspect of this disclosure is a wireless communication device that includes a radio frequency front end and an antenna. The radio frequency front end includes an acoustic wave device. The acoustic wave device includes a Lamb wave element and a bulk acoustic wave resonator. The Lamb wave element and the bulk acoustic wave element are implemented on a common substrate of a die. The bulk acoustic wave resonator is included in a band pass filter arranged to filter a radio frequency signal. The antenna in communication with the band pass filter.

The bulk acoustic wave resonator can be a film bulk acoustic wave resonator. The common substrate can be a silicon substrate. The Lamb wave element can include an aluminum nitride layer.

Another aspect of this disclosure is an acoustic wave filter that includes a Lamb wave resonator and a second acoustic wave resonator electrically coupled to the Lamb wave resonator. The second acoustic wave resonator is a different type of acoustic wave resonator than the Lamb wave resonator. The acoustic wave filter configured to filter a radio frequency signal.

The Lamb wave resonator and the second acoustic wave resonator can be implemented on a common substrate of a die. The common substrate can be a silicon substrate. The Lamb wave resonator can include a piezoelectric layer that includes the same material as a piezoelectric layer of the second acoustic wave resonator. The piezoelectric layer of the Lamb wave resonator can be an aluminum nitride layer.

The second acoustic wave resonator can be a film bulk acoustic wave resonator. The Lamb wave resonator and the film bulk acoustic wave resonator can share a cavity. The Lamb wave resonator and the film bulk acoustic wave resonator can include separate cavities.

The second acoustic wave resonator can be a surface acoustic wave resonator.

The Lamb wave resonator can be a series resonator and the second acoustic wave resonator can be a shunt resonator. The Lamb wave resonator can be a shunt resonator and the second acoustic wave resonator can be a series resonator.

The acoustic wave filter can further include a plurality of additional acoustic wave resonators. The additional acoustic wave resonators can be the same type of acoustic wave resonator as the second acoustic wave resonator.

The acoustic wave filter can include a first number of acoustic wave resonators that are the same type of acoustic wave resonator as the second acoustic wave resonator, in which the first number being at least twice as many as a second number of one or more Lamb wave resonators of the acoustic wave filter.

Another aspect of this disclosure is a wireless communication device that includes an acoustic wave filter and an antenna in communication with the acoustic wave filter. The acoustic wave filter is configured to filter a radio frequency signal. The acoustic wave filter includes a Lamb wave resonator and a second of acoustic wave resonator. The Lamb wave resonator and the second acoustic wave resonator are implemented on a common substrate. The second acoustic wave resonator is a different type of acoustic wave resonator than the Lamb wave resonator;

The second type of acoustic wave resonator can be a film bulk acoustic wave resonator, and the Lamb wave resonator can include a piezoelectric layer that includes the same material as a piezoelectric layer of the film bulk wave resonator.

Another aspect of this disclosure is an acoustic wave filter assembly that includes a first acoustic wave filter and a second acoustic wave filter. The first acoustic wave filter is configured to filter a first radio frequency signal. The first acoustic wave filter includes a Lamb wave resonator implemented on a substrate of a die. The second acoustic wave filter is configured to filter a second radio frequency signal. The second acoustic wave filter including an acoustic wave resonator implemented on the same substrate of the die as the Lamb wave resonator. The acoustic wave resonator is a different type of acoustic wave resonator than the Lamb wave resonator.

The acoustic wave resonator can be a film bulk acoustic wave resonator. The Lamb wave resonator can include a piezoelectric layer that includes the same material as a piezoelectric layer of the acoustic wave resonator.

The first acoustic wave filter and the second acoustic wave filter can be e coupled together at a common node of a multiplexer. The multiplexer can be a duplexer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/287,802, titled "LAMB WAVE LOOP CIRCUIT FOR ACOUSTIC WAVE FILTER," filed on even date herewith, the entire disclosure of which is hereby incorporated by reference herein. The present disclosure relates to U.S. patent application Ser. No. 16/287,891, titled "LAMB WAVE ELEMENT AND BULK ACOUSTIC WAVE RESONATOR ON COMMON SUBSTRATE," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 2 is a diagram of cross section of an acoustic wave device that includes a Lamb wave element and a solidly mounted resonator (SMR) on a substrate according to an embodiment.

FIG. 3A is a diagram of cross section of an acoustic wave device that includes a Lamb wave element and a surface acoustic wave (SAW) resonator of an acoustic on a common substrate according to an embodiment.

FIG. 5C is a diagram of cross section of an acoustic wave device that includes a Lamb wave element and a solidly mounted Lamb wave resonator on a common substrate according to another embodiment.

FIGS. 11A to 11F are diagrams of cross sections of Lamb wave elements with gratings. FIG. 11A illustrates a Lamb wave element with a grounded electrode.

FIG. 11B illustrates a Lamb wave element with a floating electrode. FIG. 11C illustrates a Lamb wave element without an electrode on a side of a piezoelectric layer that opposes an interdigital transducer (IDT) electrode. FIG. 11D illustrates another Lamb wave element.

FIG. 11E illustrates another Lamb wave element. FIG. 11F illustrates another Lamb wave element.

FIGS. 12A to 12F are diagrams of cross sections of Lamb wave elements with free edges. FIG. 12A illustrates a Lamb wave element with a grounded electrode.

FIG. 12B illustrates a Lamb wave element with a floating electrode. FIG. 12C illustrates a Lamb wave element without an electrode on a side of a piezoelectric layer that opposes an IDT electrode. FIG. 12D illustrates another Lamb wave element. FIG. 12E illustrates another Lamb wave element. FIG. 12F illustrates another Lamb wave element.

FIG. 21A is a schematic diagram of an acoustic wave filter that includes series Lamb wave resonators and other shunt acoustic wave resonators according to an embodiment.

FIG. 21B is a schematic diagram of an acoustic wave filter that includes shunt Lamb wave resonators and other series acoustic wave resonators according to an embodiment.

FIG. 21C is a schematic diagram of an acoustic wave filter that includes a series Lamb wave resonator and other acoustic wave resonators coupled to an antenna port via the series Lamb wave resonator according to an embodiment.

FIG. 21D is a schematic diagram of an acoustic wave filter that includes a series Lamb wave resonator and other acoustic wave resonators coupled to a radio frequency port via the series Lamb wave resonator according to an embodiment.

DETAILED DESCRIPTION OF CERTAIN EMBODIMENTS

Figure 1A:
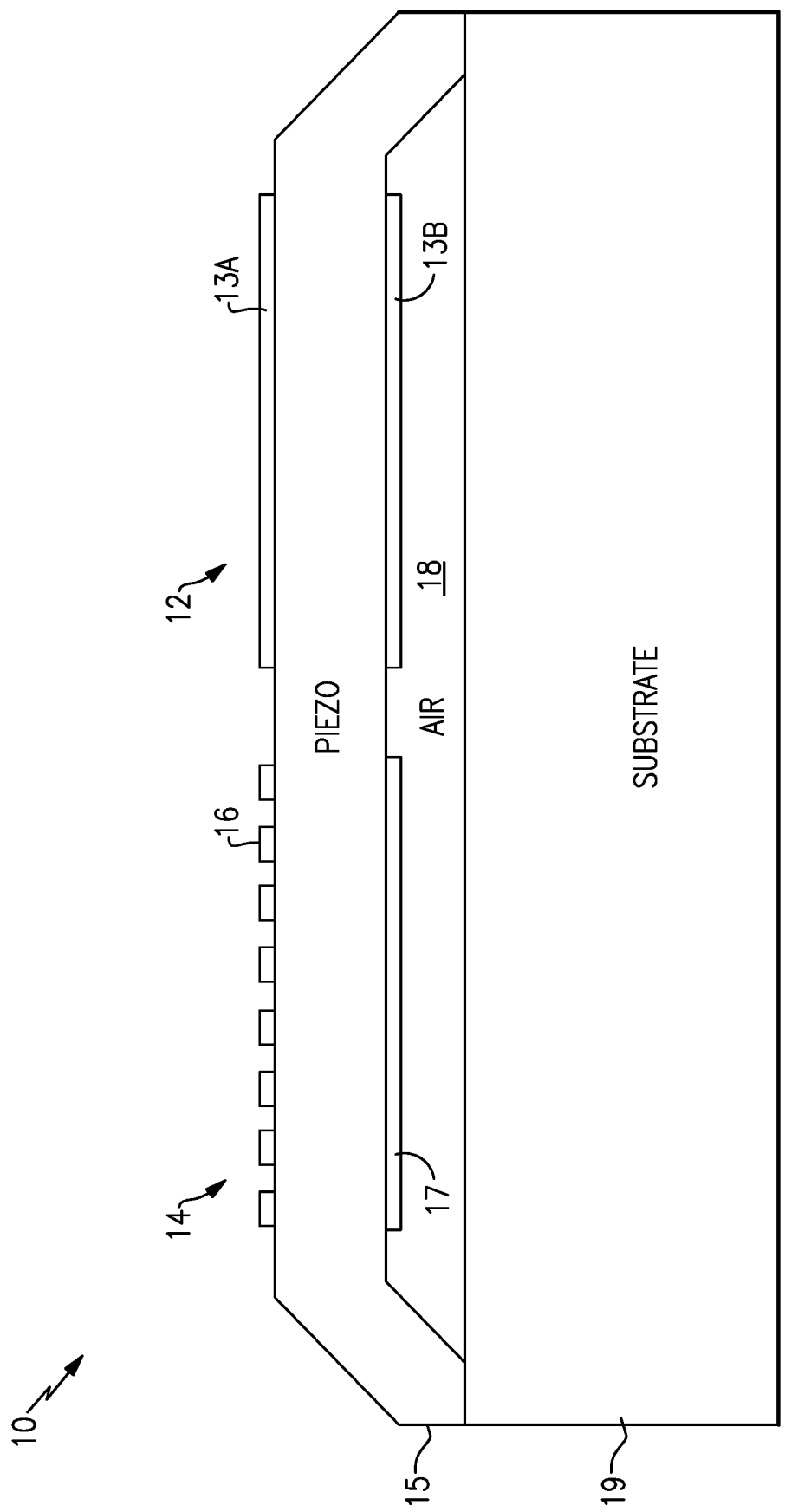
FIG. 1A is a diagram of cross section of an acoustic wave device that includes a Lamb wave element and a film bulk acoustic resonator (FBAR) on a common substrate according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

An acoustic wave filter can include a loop circuit to cancel an unwanted frequency component. The loop circuit can enhance transmit/receive isolation and attenuation for a particular frequency range. The loop circuit can apply a signal having approximately the same amplitude and an opposite phase to a signal component to be canceled. Surface acoustic wave (SAW) loops circuits have been used to suppress isolation and attenuation in SAW filters. Some loop circuits for film bulk acoustic resonator (FBAR) filters and other bulk acoustic wave (BAW) filters have included LC circuits. Such LC circuits can include capacitor(s) and/or inductor(s) having a relatively large physical footprint and/or can be implemented external to a chip that includes the BAW filter coupled to the loop circuit.

Lamb wave loop circuits are disclosed. Lamb wave loop circuits can be integrated with BAW filters and/or duplexers. For instance, aluminum nitride (AlN) Lamb wave loop circuits can be integrated with aluminum nitride FBAR filters. Such Lamb wave loop circuits can suppress transmit/receive (Tx/Rx) isolation and attenuation at any desired frequency range. A Lamb wave loop circuit can generate an anti-phase radio frequency (RF) signal to cancel a target signal at a desired frequency. The Lamb wave loop circuits discussed herein can improve the isolation and attenuation of RF acoustic wave filters, such as BAW filters (e.g., FBAR filters or SMR filters), SAW filters, and Lamb wave filters.

A Lamb wave element can be a Lamb wave resonator or a Lamb wave delay line. A Lamb wave element can combine features of a SAW element and a BAW element. A Lamb wave resonator typically includes an interdigital transducer (IDT) electrode similar to a SAW resonator. Accordingly, the frequency of the Lamb wave resonator can be lithographically defined. A Lamb wave element can achieve a relatively high quality factor (Q) and a relatively high phase velocity like a BAW filter. The relatively high Q of a Lamb wave resonators can be due to, for example, a suspended structure. A Lamb wave element that includes an aluminum nitride piezoelectric layer can be relatively easy to integrate with other circuits, for example, because aluminum nitride process technology can be compatible with complementary metal oxide semiconductor (CMOS) process technology. Aluminum nitride Lamb wave resonators can overcome a relatively low resonance frequency limitation and integration challenge associated with SAW resonators and also overcome multiple frequency capability challenges associated with BAW resonators. Some Lamb wave resonator topologies are based on acoustic reflection from periodic reflective gratings. Some other Lamb wave resonator topologies are based on acoustic reflection from suspended free edges of a piezoelectric layer.

A Lamb wave loop circuit and a BAW resonator of an acoustic wave filter can be implemented on a common substrate. An aluminum nitride Lamb wave loop circuit can be directly integrated with aluminum nitride FBAR filter and/or other BAW filters during processing to form such filters. Such integration can also be achieved for other suitable piezoelectric films. Accordingly, a Lamb wave loop circuit can have offer a cost effective and efficient way to include a loop circuit for a BAW filter. A Lamb wave loop circuit integrated with a BAW filter can be manufactured with characteristics sufficient for a loop circuit in a cost effective manner. A Lamb wave loop circuit for a BAW filter can be implemented in a relatively small physical footprint. For example, a Lamb wave loop circuit can have a smaller physical footprint than an LC circuit based loop circuit. A smaller physical footprint can reduce power consumption and/or reduce manufacturing costs.

Lamb wave elements in a loop circuit discussed herein can operate in any suitable acoustic wave mode. Example acoustic wave modes that can be utilized in Lamb wave elements discussed herein include the lowest-order asymmetric ($A_0$) mode, the lowest-order symmetric ($S_0$) mode, the lowest-order shear horizontal ($SH_0$) mode, the first-order asymmetric ($A_1$) mode, the first-order symmetric ($S_1$) mode, the first-order shear horizontal ($SH_1$) mode, the second-order asymmetric ($A_2$) mode, the second-order symmetric ($S_2$) mode, the second-order shear horizontal ($SH_2$) mode, and the like.

A Lamb wave element and a different type of acoustic wave resonator can be implemented on the same substrate of a die. The Lamb wave element can be included in a loop circuit and the different element can be in an acoustic wave filter coupled to the loop circuit. A Lamb wave element and a different type of acoustic wave element on a common substrate can be implemented in a variety of other applications. In certain instances, an acoustic wave filter can include a Lamb wave resonator and a different type of acoustic wave resonator implemented on the same die. For example, an acoustic wave filter can include a Lamb wave resonator and an FBAR implemented on a common substrate. According to certain applications, a first acoustic wave filter can include a Lamb wave resonator and a second acoustic wave filter can include a different type of acoustic wave resonator, in which the Lamb wave resonator and the different type of acoustic wave resonator are implemented on a common substrate.

A loop circuit can include a free-standing Lamb wave element. For example, such a Lamb wave element and a resonator of an acoustic wave filter coupled to the loop circuit can be implemented in accordance with any suitable principles and advantages of the acoustic wave devices of FIGS. 1A to 5D. The acoustic wave devices of FIGS. 1A to 5D can also be implemented in other applications. Any suitable combination of features of the acoustic wave devices of FIGS. 1A to 5D can be implemented together with each other.

FIG. 1A is a diagram of cross section of an acoustic wave device 10 that includes a film bulk acoustic resonator (FBAR) 12 and a Lamb wave element 14 according to an embodiment. The FBAR 12 and the Lamb wave element 14 are implemented on a common substrate 19. The FBAR 12 can be included in an acoustic wave filter and the Lamb wave element 14 can be included in a loop circuit. The FBAR 12 includes electrodes 13A and 13B on opposing sides of a piezoelectric substrate 15. The Lamb wave element 14 can be a Lamb wave resonator in certain instances. A Lamb wave resonator is a type of acoustic wave resonator. The Lamb wave element 14 can be a delay line in some instances. A Lamb wave delay line can include two sets of interdigital transducers.

The Lamb wave element 14 includes feature of a SAW resonator and an FBAR. As illustrated, the Lamb wave element 14 includes a piezoelectric layer 15, an interdigital transducer electrode (IDT) electrode 16 on the piezoelectric layer 15, and an electrode 17. The piezoelectric layer 15 can be a thin film. The piezoelectric layer 15 can be an aluminum nitride layer. In other instances, the piezoelectric layer 15 can be any suitable piezoelectric layer. For example, the piezoelectric layer 15 can be a lithium niobate layer or a lithium tantalate layer. The frequency of the Lamb wave resonator can be based on the geometry of the IDT electrode 16. In some instances, the illustrated IDTs of the Lamb wave element 14 represent two sets of IDTs. The electrode 17 can be grounded in certain instances. In some other instances, the electrode 17 can be floating. An air cavity 18 is disposed between the electrode 17 and a substrate 19. Any suitable cavity can be implemented in place of the air cavity 18. The substrate 19 can be a semiconductor substrate. For example, the substrate 19 can be a silicon substrate. The substrate 19 can be any other suitable substrate, such as a quartz substrate, a sapphire substrate, or a spinel substrate.

In the acoustic wave device 10, the Lamb wave resonator 14 and the FBAR 12 share a piezoelectric layer 15. A first portion of the piezoelectric layer 15 can be considered the piezoelectric layer of the FBAR 12 and a second portion of the piezoelectric layer 15 can be considered the piezoelectric layer of the Lamb wave element 14. As also illustrated in FIG. 1A, the Lamb wave resonator 14 and the FBAR share an air cavity 18. In certain applications, sharing an air cavity 18 can reduce the size of an acoustic wave device relative to implementing separate air cavities. The Lamb wave resonator 14 and the FBAR 12 can be disposed on a common semiconductor substrate 19. The semiconductor substrate 19 can be a silicon substrate.

Figure 1B:
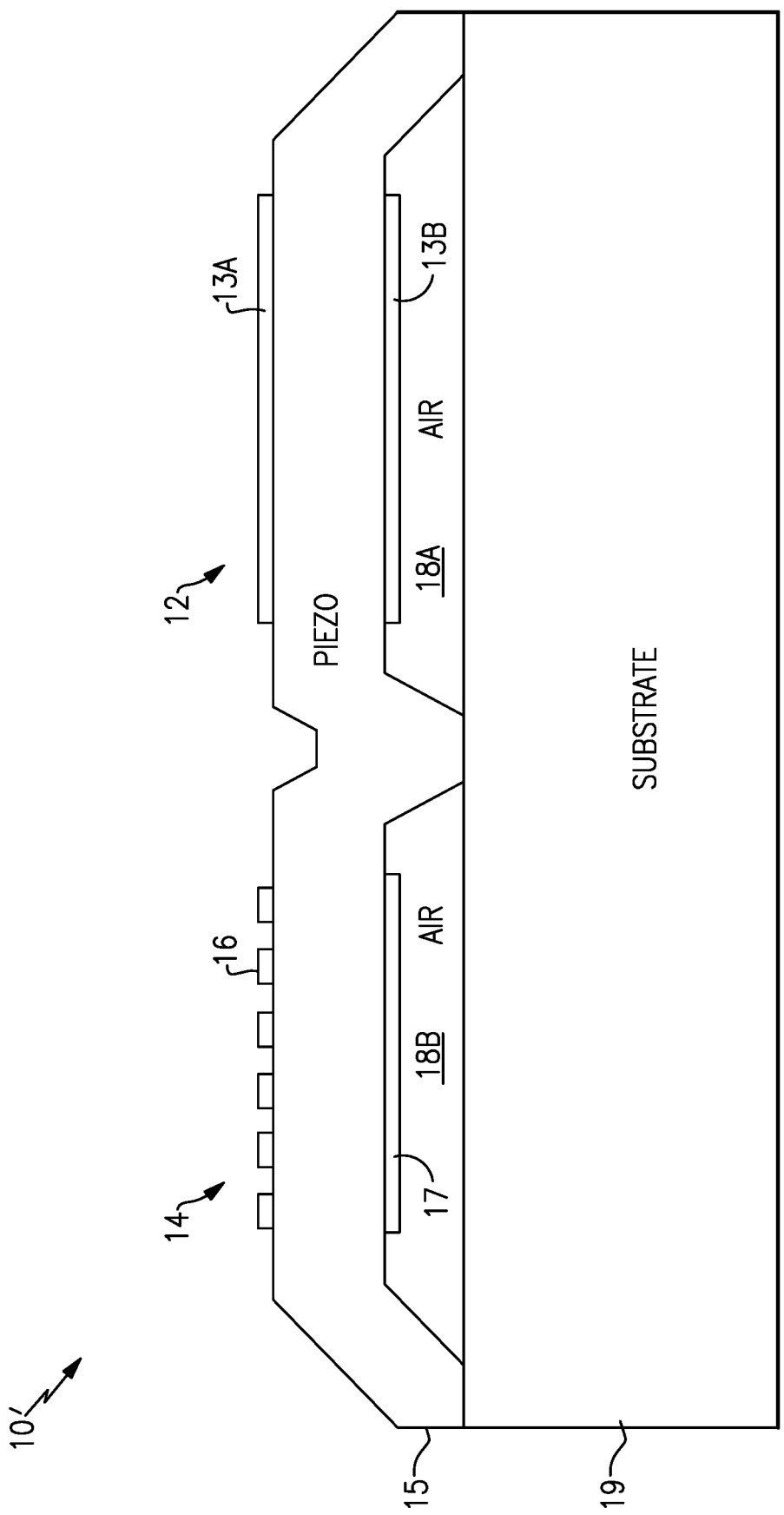
FIG. 1B is a diagram of cross section of an acoustic wave device that includes a Lamb wave element and an FBAR on a common substrate according to another embodiment.

FIG. 1B is a diagram of cross section of an acoustic wave device 10' that includes an FBAR 12' and a Lamb wave element 14' according to an embodiment. The acoustic wave device 10' is like the acoustic wave device 10 of FIG. 1A except that separate air cavities 18A and 18B are included in the acoustic wave device 10' for the FBAR 12' and the Lamb wave element 14', respectively. In the acoustic wave device 10', a first air cavity 18A is provided for the FBAR 12' and a second air cavity 18B is provided for the Lamb wave element 14'. In certain instances, having separate air cavities can be beneficial for maintaining the mechanical integrity of the acoustic wave device 10' and/or reducing cross talk between the FBAR 12 and the Lamb wave element 14.

Figure 1C:
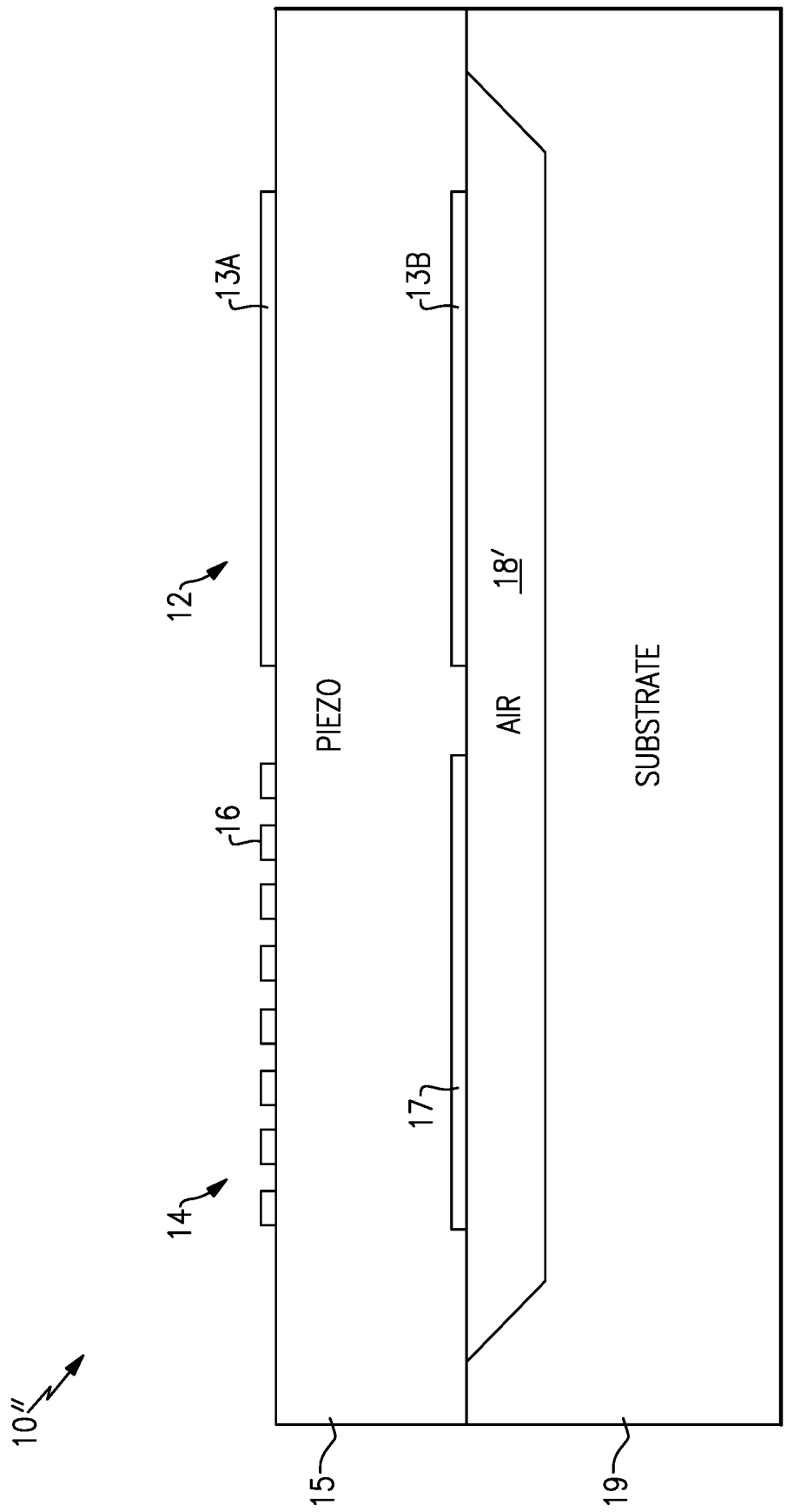
FIG. 1C is a diagram of cross section of an acoustic wave device that includes a Lamb wave element and an FBAR on a common substrate according to another embodiment.

FIG. 1C is a diagram of cross section of an acoustic wave device 10" that includes an FBAR 12" and a Lamb wave element 14" according to an embodiment. The acoustic wave device 10" is like the acoustic wave device 10 of FIG. 1A except that an air cavity is implemented in the substrate 19' instead of over the substrate 19 of FIG. 1A. An air cavity 18' can be implemented for the acoustic wave device 10" by etching a portion of the substrate 19'.

Figure 1D:
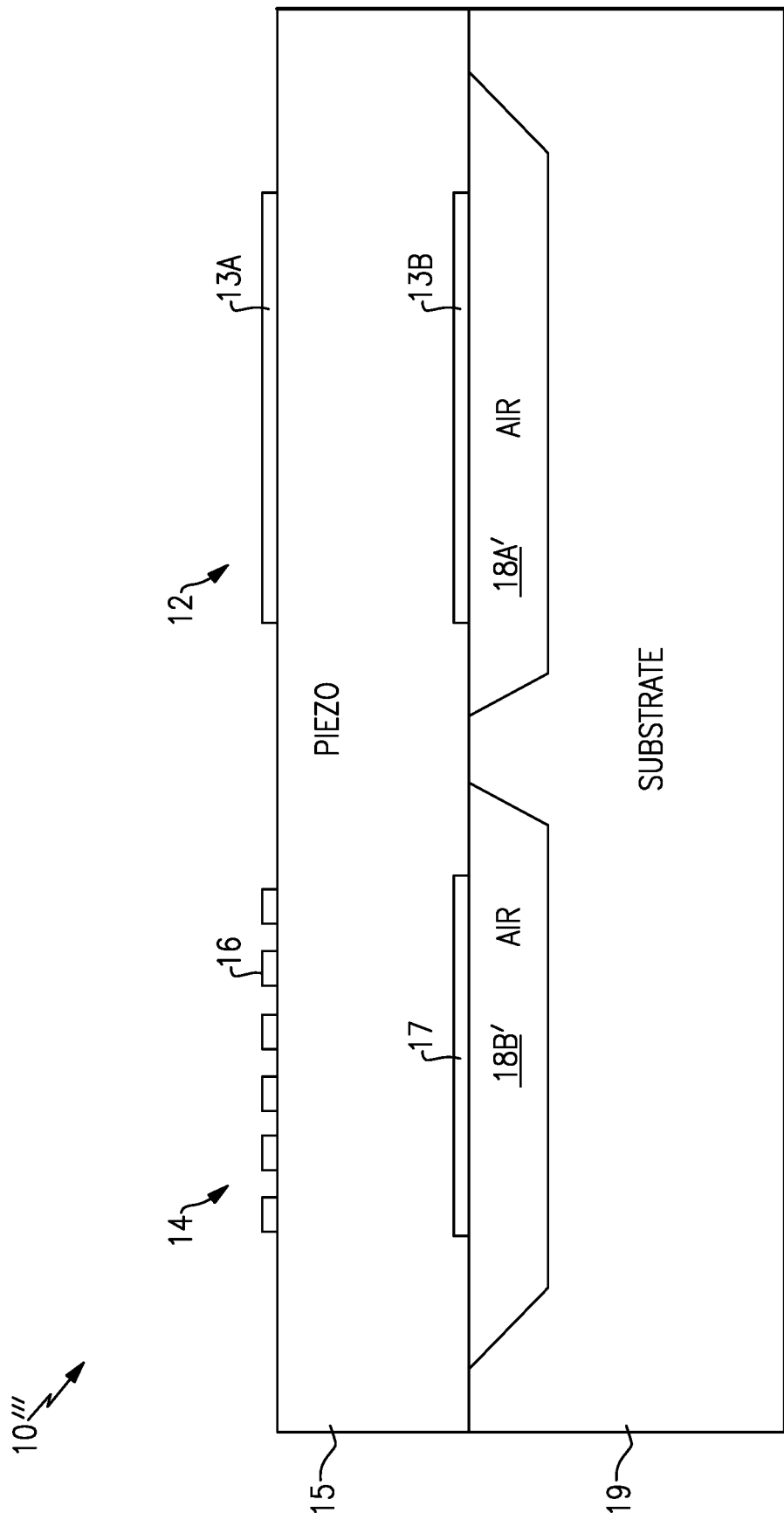
FIG. 1D is a diagram of cross section of an acoustic wave device that includes a Lamb wave element and an FBAR on a common substrate according to another embodiment.

FIG. 1D is a diagram of cross section of an acoustic wave device 10''' that includes an FBAR 12''' and a Lamb wave element 14''' according to an embodiment. The acoustic wave device 10''' is like the acoustic wave device 10' of FIG. 1B except that air cavities are implemented in the substrate 19" instead of over the substrate 19 of FIG. 1B. The air cavities 18A' and 18B' can be implemented for the acoustic wave device 10''' by etching portions of the substrate 19".

FIG. 2 is a diagram of cross section of an acoustic wave device 20 that includes a Lamb wave element 14 and a solidly mounted resonator (SMR) 22 according to an embodiment. In the acoustic wave device 20, the SMR 22 and the Lamb wave element 14 are implemented on a common substrate 19. The SMR 22 can be included in an acoustic wave filter and the Lamb wave element 14 can be included in a loop circuit. The SMR 22 and the Lamb wave element 14 can include the same piezoelectric material, such as aluminum nitride (AlN). A piezoelectric layer 15' of the acoustic wave device 20 can include a first portion that serves as a piezoelectric layer for the Lamb wave element 14 and a second portion that serves as a piezoelectric layer for the SMR 22. The piezoelectric layer 15' can have a different shape than the piezoelectric layer 15 in the acoustic wave device 10 of FIG. 1A.

The SMR 22 includes an acoustic mirror located between the substrate 19 and the electrode 13B. The illustrated acoustic mirror includes Bragg reflectors 24. As illustrated, the Bragg reflectors 24 include alternating low impedance and high impedance layers 25 and 26, respectively. As an example, the Bragg reflectors 24 can include silicon dioxide (SiO$_2$) layers and tungsten (W) layers. As another example, the Bragg reflectors 24 can include silicon dioxide layers and molybdenum (Mo) layers. Any other suitable Bragg reflectors can alternatively or additionally be included in the SMR 22. The Lamb wave element 14 of FIG. 2 includes its own an air cavity 18B. The Lamb wave element 14 and the SMR 22 can be disposed on a common substrate 19. The substrate 19 can be a semiconductor substrate. For example, the substrate 19 can be a silicon substrate. The substrate 19 can be any other suitable substrate disclosed herein.

FIG. 3A is a diagram of cross section of an acoustic wave device 30 that includes a Lamb wave element 14 and a surface acoustic wave (SAW) resonator 32 according to an embodiment. In the acoustic wave device 30, the SAW resonator 32 and the Lamb wave element 14 are implemented on a common substrate 19. The SAW resonator 32 can be included an acoustic wave filter and the Lamb wave element can be included in a loop circuit. The SAW resonator 32 can include any suitable piezoelectric layer, such as an aluminum nitride layer, a lithium niobate layer, a lithium tantalate layer, or any suitable combination thereof. The SAW resonator 32 and the Lamb wave element 14 can include the same piezoelectric material, such as aluminum nitride, lithium niobate or lithium tantalate. A piezoelectric layer 15" of the acoustic wave device 30 can include a first portion that serves as a piezoelectric layer for the Lamb wave element 14 and a second portion that serves as a piezoelectric layer for the SAW resonator 32. The SAW resonator 32 includes an IDT electrode 34 on the piezoelectric layer 15'. The piezoelectric layer 15" can have a different shape than the piezoelectric layer 15 in the acoustic wave device 10 of FIG. 1A. The Lamb wave element 14 and the SAW 32 can be disposed on a common substrate 19. The substrate 19 can be a semiconductor substrate, such as a silicon substrate.

Figure 3B:
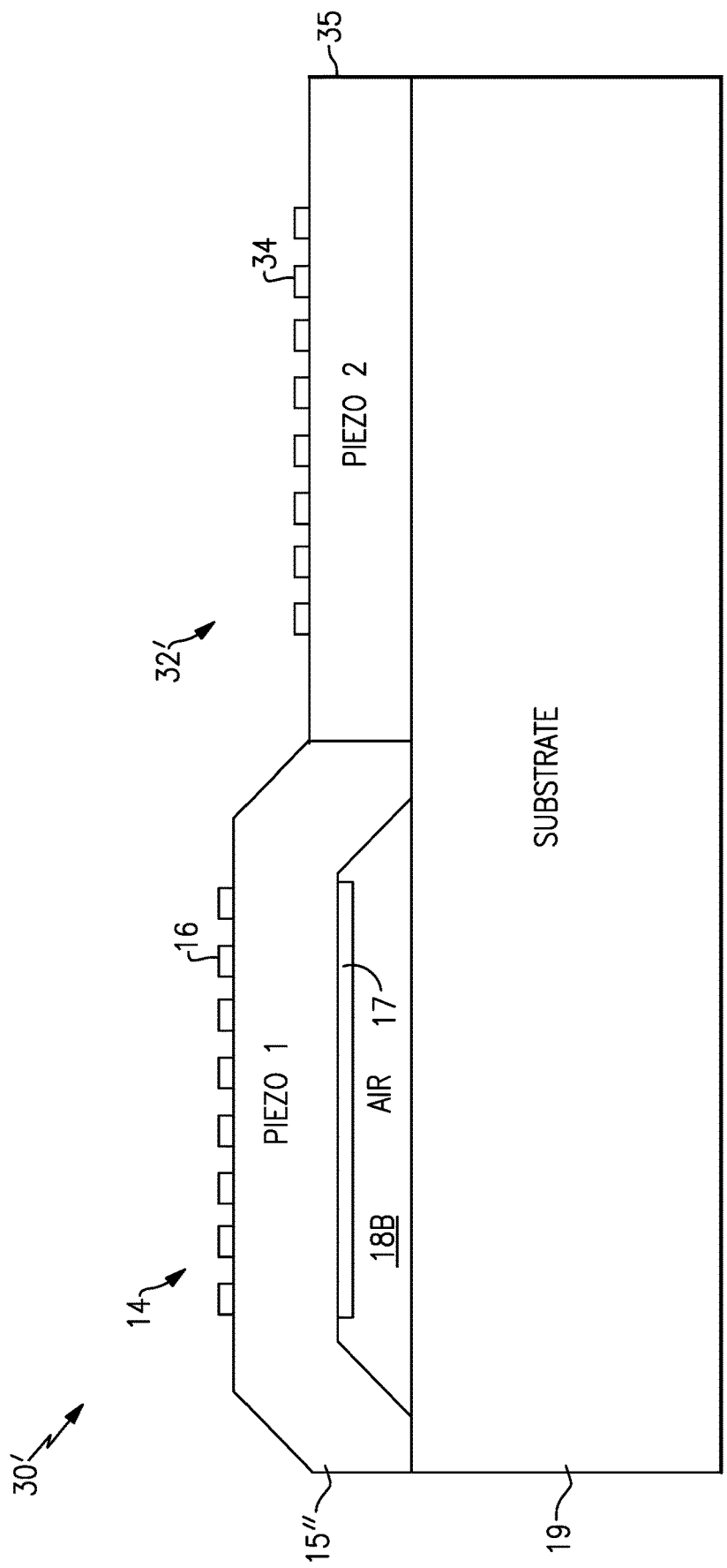
FIG. 3B is a diagram of cross section of an acoustic wave device that includes a Lamb wave element and a SAW resonator of an acoustic on a common substrate according to another embodiment.

FIG. 3B is a diagram of cross section of an acoustic wave device 30' that includes a Lamb wave element 14 and an SAW resonator 32' according to an embodiment. The acoustic wave device 30' is like the acoustic wave device 30 of FIG. 3A except that the respective piezoelectric layers 15" and 35 of the Lamb wave element 14 and the SAW resonator 32' include different piezoelectric material. For example, the SAW resonator 32' can include a lithium niobate piezoelectric layer 35 and the Lamb wave element 14 can include a lithium niobate piezoelectric layer 15". As another example, the SAW resonator 32' can include a lithium tantalate piezoelectric layer 35 and the Lamb wave element 14 can include a lithium tantalate piezoelectric layer 15".

Although the acoustic wave devices 30 and 30' are illustrated with a Lamb wave element that includes a cavity 18B over the substrate 19, similar acoustic wave devices can be implemented with a cavity in the substrate (e.g., like the cavity 18B' of FIG. 1B).

Figure 4A:
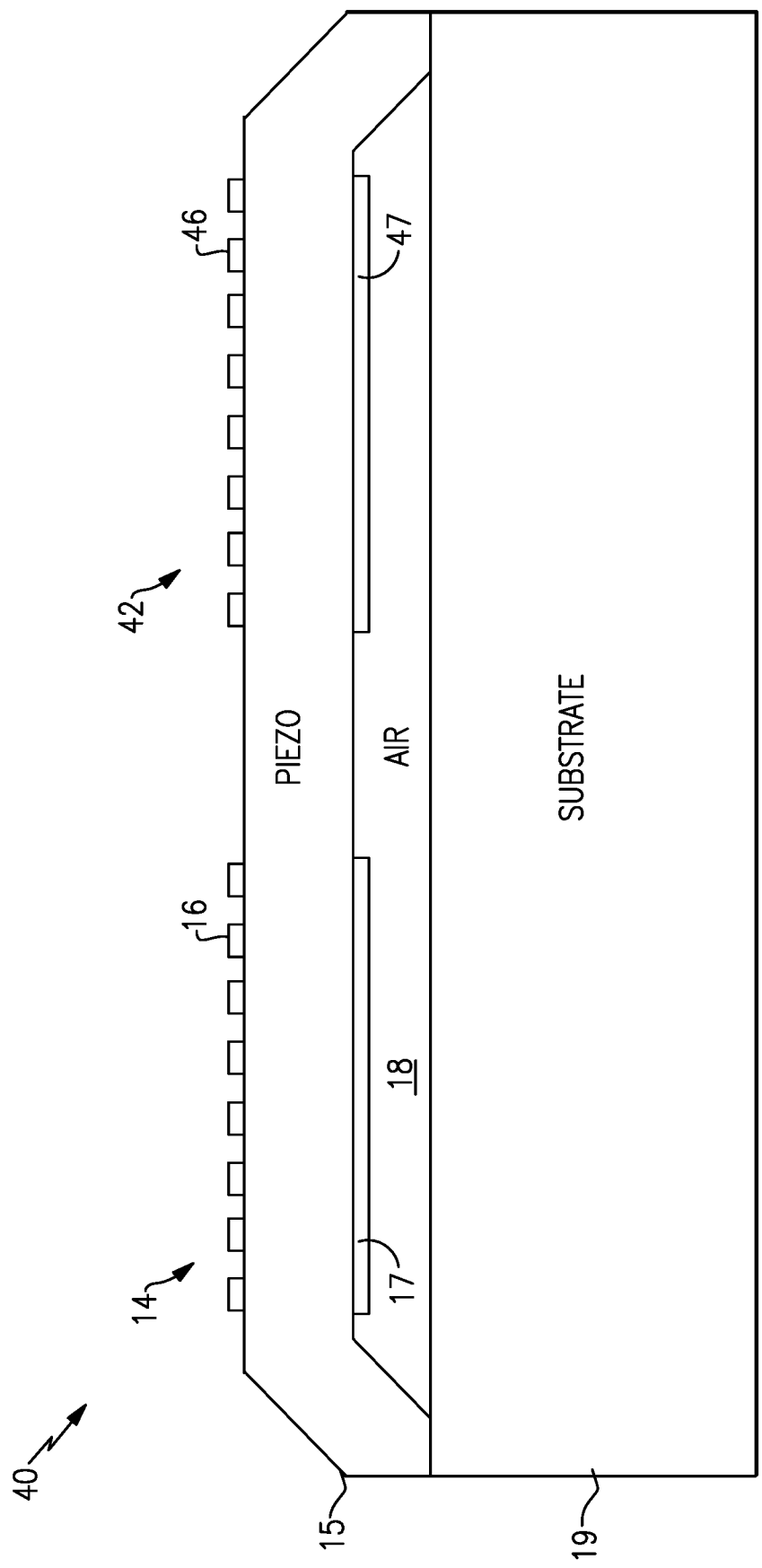
FIG. 4A is a diagram of cross section of an acoustic wave device that includes a Lamb wave element and a Lamb wave resonator on a common substrate according to an embodiment.

FIG. 4A is a diagram of cross section of an acoustic wave device 40 that includes a Lamb wave element 14 and a Lamb wave resonator 42 according to an embodiment. In the acoustic wave device 40, the Lamb wave resonator 42 and the Lamb wave element 14 are implemented on a common substrate 19. The Lamb wave resonator 42 can be included in an acoustic wave filter and the Lamb wave element 14 can be included in a loop circuit. The Lamb wave resonator 42 can have the same or similar structure as the Lamb wave element 14. In some instances, the Lamb wave element 14 can include two sets of IDTs and the Lamb wave resonator 42 can include a single set of IDTs. The Lamb wave element 14 and The Lamb wave resonator 42 can share a piezoelectric layer 15. As shown in FIG. 4A, the Lamb wave element 14 and The Lamb wave resonator 42 can share an air cavity 18. In certain applications, sharing an air cavity 18 can reduce the size of an acoustic wave device relative to implementing separate air cavities.

Figure 4B:
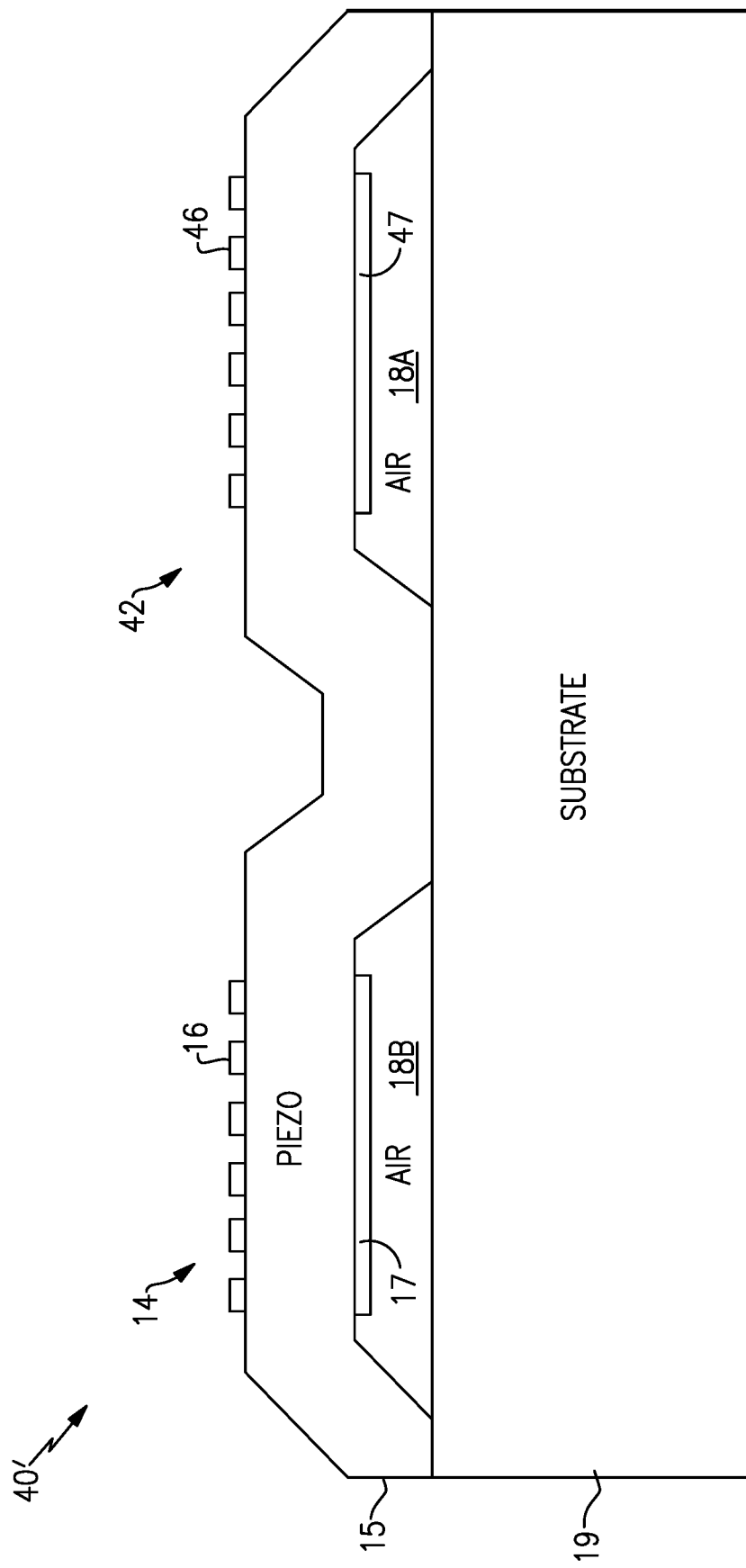
FIG. 4B is a diagram of cross section of an acoustic wave device that includes a Lamb wave element and a Lamb wave resonator on a common substrate according to another embodiment.

FIG. 4B is a diagram of cross section of an acoustic wave device 40' that includes a Lamb wave element 14 and a Lamb wave resonator 42 according to an embodiment. The acoustic wave device 40' is like the acoustic wave device 40 of FIG. 4A except that separate air cavities 18A and 18B are included in the acoustic wave device 40' for the Lamb wave resonator 42 and the Lamb wave element 14, respectively. In the acoustic wave device 40', a first air cavity 18A is provided for the Lamb wave resonator 42 and a second air cavity 18B is provided for the Lamb wave element 14. In certain instances, having separate air cavities can be beneficial for maintaining the mechanical integrity of the acoustic wave device 40' and/or reducing cross talk between the Lamb wave resonator 42 and the Lamb wave element 14.

Figure 5A:
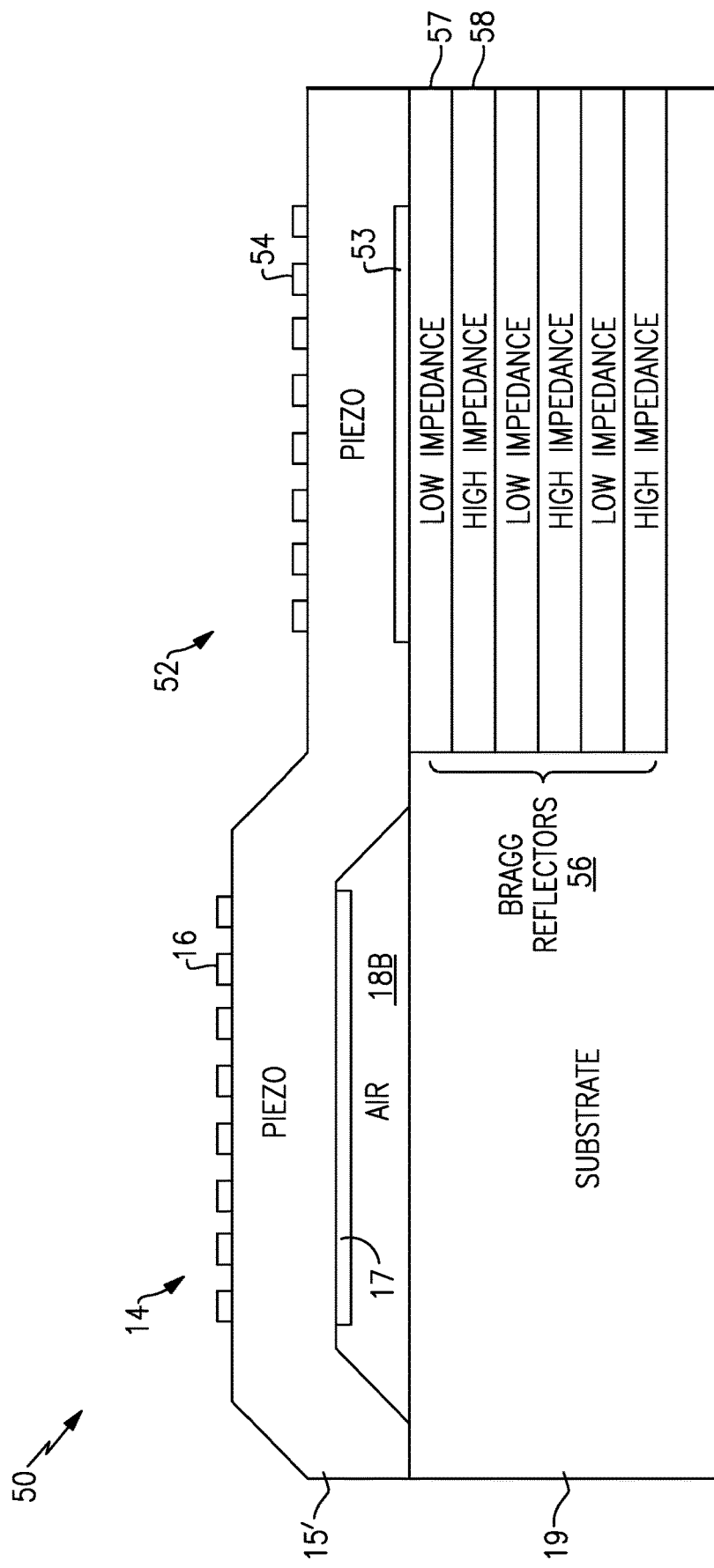
FIG. 5A is a diagram of cross section of an acoustic wave device that includes a Lamb wave element and a solidly mounted Lamb wave resonator on a common substrate according to an embodiment.

FIG. 5A is a diagram of cross section of an acoustic wave device 50 that includes a Lamb wave element 14 and a solidly mounted Lamb wave resonator 52 according to an embodiment. In the acoustic wave device 50, the solidly mounted Lamb wave resonator 52 and the Lamb wave element 14 are implemented on a common substrate 19. The solidly mounted Lamb wave resonator 52 can be included in an acoustic wave filter and the Lamb wave element 14 can be included in a loop circuit. The solidly mounted Lamb wave resonator 52 and the Lamb wave element 14 can include the same piezoelectric material, such as aluminum nitride. A piezoelectric layer 15' of the acoustic wave device 50 can include a first portion that serves as a piezoelectric layer for the Lamb wave element 14 and a second portion that serves as a piezoelectric layer for the solidly mounted Lamb wave resonator 52.

The solidly mounted Lamb wave resonator 52 includes features of a SAW resonator and an SMR. The solidly mounted Lamb wave resonator 52 includes a lower electrode 53, a piezoelectric layer, an IDT electrode 54 on the piezoelectric layer, and an acoustic mirror located between the substrate 19 and the electrode 53. The illustrated acoustic mirror includes Bragg reflectors 56. As illustrated, the Bragg reflectors 56 include alternating low impedance and high impedance layers 57 and 58, respectively. As an example, the Bragg reflectors 56 can include silicon dioxide layers and tungsten layers. Any other suitable Bragg reflectors can alternatively or additionally be included in the solidly mounted Lamb wave resonator 52. The solidly mounted Lamb wave resonator 52 can include an aluminum nitride piezoelectric layer, for example.

Figure 5B:
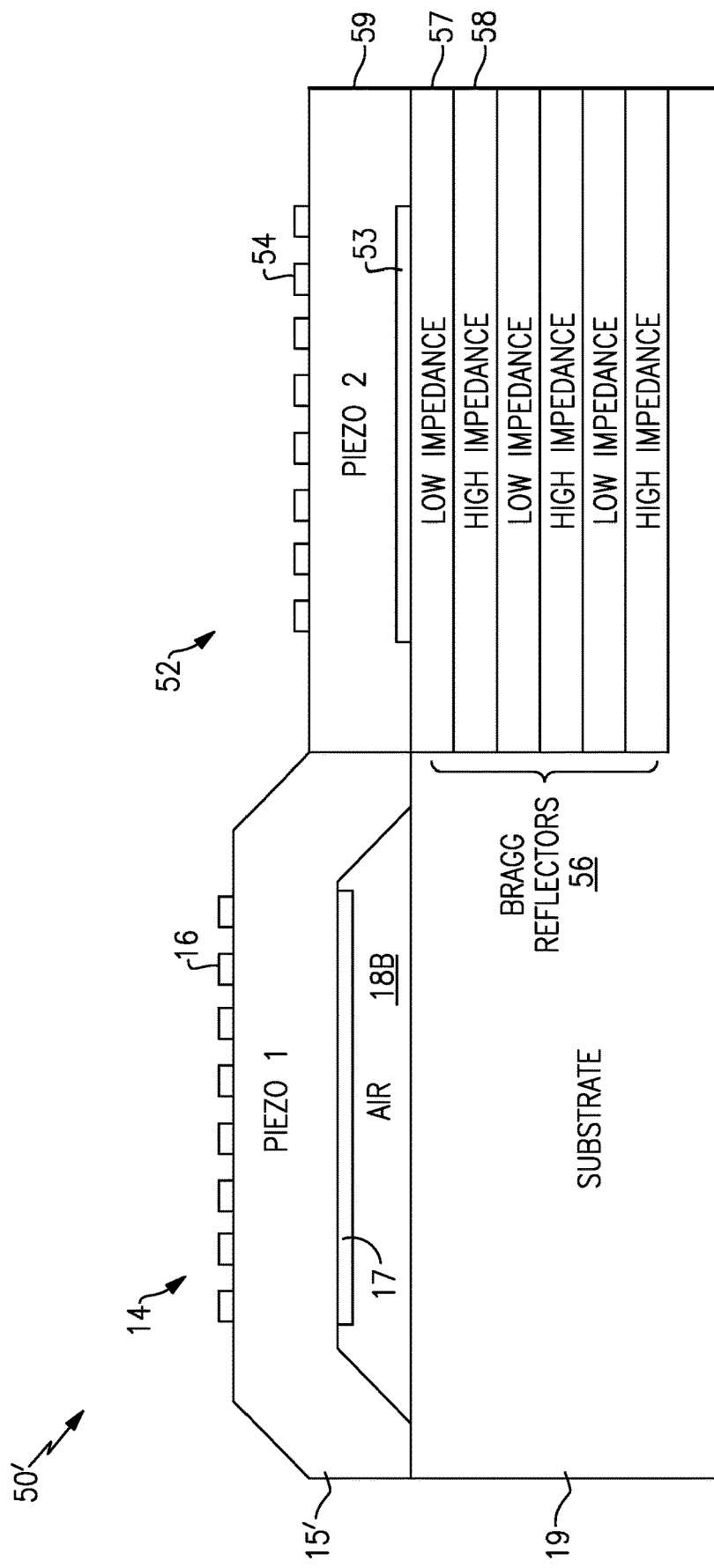
FIG. 5B is a diagram of cross section of an acoustic wave device that includes a Lamb wave element and a solidly mounted Lamb wave resonator on a common substrate according to another embodiment.

FIG. 5B is a diagram of cross section of an acoustic wave device 50' that includes a Lamb wave element 14 and solidly mounted Lamb wave resonator 52 according to an embodiment. The acoustic wave device 50' is like the acoustic wave device 50 of FIG. 5A except that the respective piezoelectric layers 15' and 59 of the Lamb wave element 14 and the solidly mounted Lamb wave resonator 52 include different piezoelectric material.

FIG. 5C is a diagram of cross section of an acoustic wave device 50" that includes a Lamb wave element 14 and solidly mounted Lamb wave resonator 52 according to an embodiment. The acoustic wave device 50" is like the acoustic wave device 50 of FIG. 5A except that an air cavity 18B' is implemented in the substrate 19 instead of over the substrate 19 of FIG. 5A. The air cavity 18B' can be implemented for the acoustic wave device 50" by etching a portion of the substrate 19'.

Figure 5D:
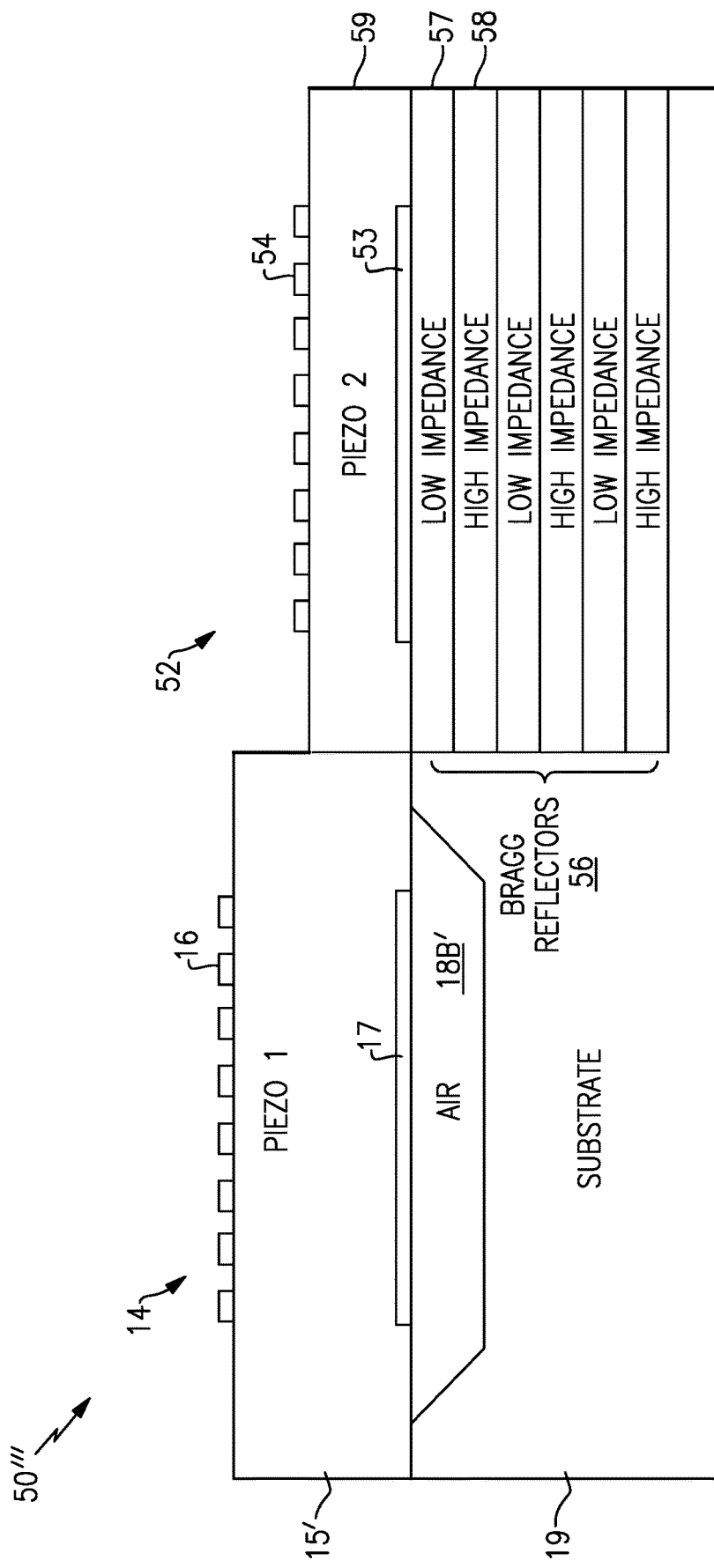
FIG. 5D is a diagram of cross section of an acoustic wave device that includes a Lamb wave element and a solidly mounted Lamb wave resonator on a common substrate according to another embodiment.

FIG. 5D is a diagram of cross section of an acoustic wave device 50''' that includes a Lamb wave element 14 and solidly mounted Lamb wave resonator 52 according to an embodiment. The acoustic wave device 50''' is like the acoustic wave device 50" of FIG. 5C except that the respective piezoelectric layers 15' and 59 of the Lamb wave element 14 and the solidly mounted Lamb wave resonator 52 include different piezoelectric material.

A loop circuit can include a solidly mounted Lamb wave element. For example, such a Lamb wave element and a resonator of an acoustic wave filter coupled to the loop circuit can be implemented in accordance with any suitable principles and advantages of the acoustic wave devices of FIGS. 6 to 10. The acoustic wave devices of FIGS. 6 to 10 can also be implemented in other applications. Any suitable combination of features of acoustic wave devices of FIGS. 6 to 10 can be implemented together with each other.

Figure 6:
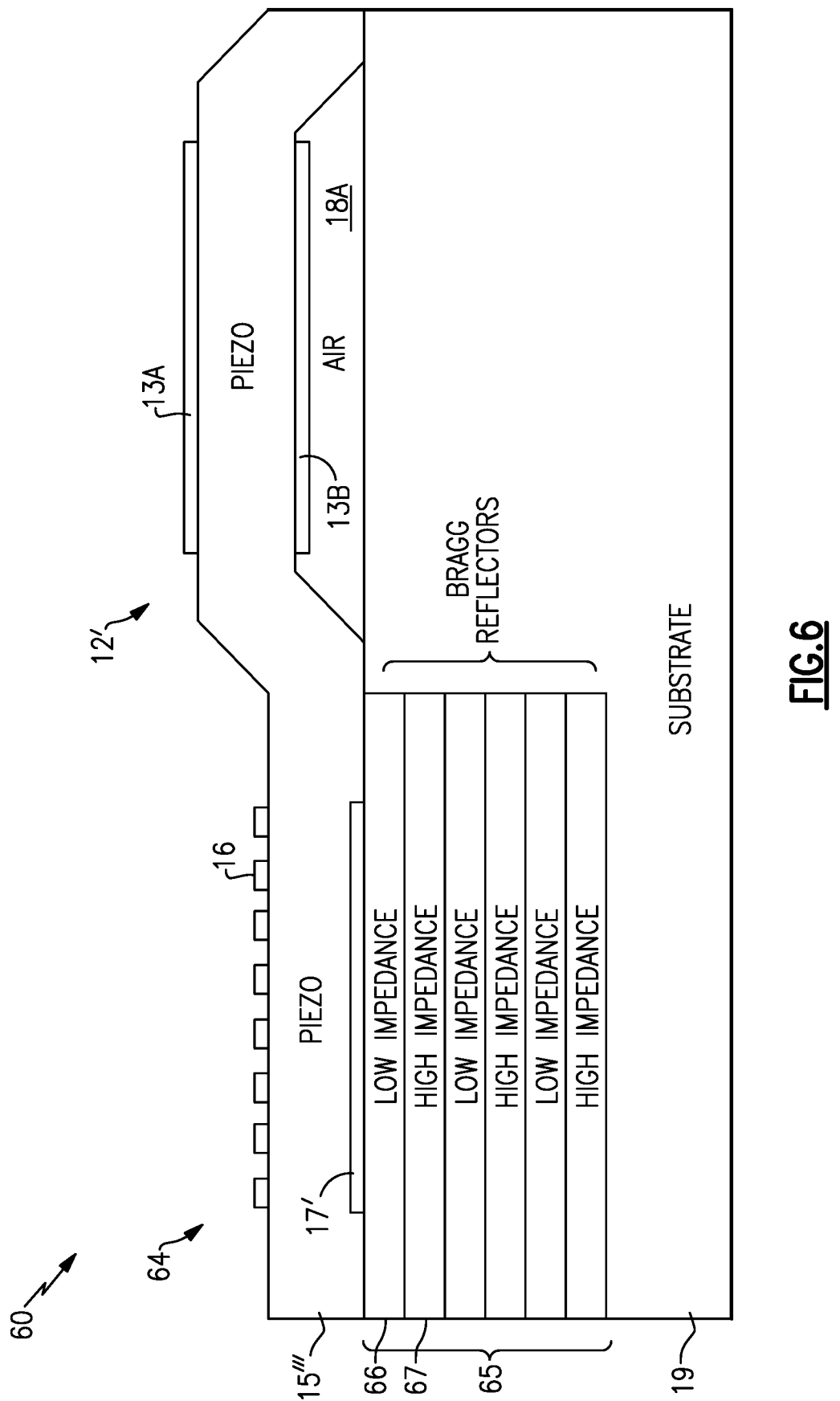
FIG. 6 is a diagram of cross section of an acoustic wave device that includes a solidly mounted Lamb wave element and an FBAR on a common substrate according to an embodiment.

FIG. 6 is a diagram of cross section of an acoustic wave device 60 that includes a solidly mounted Lamb wave element 64 and an FBAR 12' according to an embodiment. The FBAR 12' and the solidly mounted Lamb wave element 64 are implemented on a common substrate 19. The FBAR 12' can be included in an acoustic wave filter and the solidly mounted Lamb wave element 64 can be included in a loop circuit. The solidly mounted Lamb wave element 64 can be a solidly mounted Lamb wave resonator in certain instances. The solidly mounted Lamb wave element 64 can be a delay line in some instances. A Lamb wave delay line can include two sets of interdigital transducers.

The Lamb wave element 64 includes feature of a SAW resonator and an SMR. As illustrated, the Lamb wave element 64 includes a piezoelectric layer 15''', an IDT electrode 16 on the piezoelectric layer 15''', and an electrode 17. The piezoelectric layer 15''' can be an aluminum nitride layer. In other instances, the piezoelectric layer 15''' can be any other suitable piezoelectric layer. The frequency of the Lamb wave element 64 can be based on the geometry of the IDT electrode 16. The electrode 17 can be grounded in certain instances. In some other instances, the electrode 17 can be floating. The Lamb wave element 64 includes an acoustic mirror located between the substrate 19 and the electrode 17. The illustrated acoustic mirror includes Bragg reflectors 65. As illustrated, the Bragg reflectors 65 include alternating low impedance and high impedance layers 66 and 67, respectively. As an example, the Bragg reflectors 65 can include silicon dioxide layers and tungsten layers. As another example, the Bragg reflectors 65 can include silicon dioxide layers and molybdenum layers. Any other suitable Bragg reflectors can alternatively or additionally be included in the Lamb wave element 64.

In the acoustic wave device 60, the Lamb wave element 64 and the FBAR 12' can share a piezoelectric layer 15'''. In some other embodiments, the Lamb wave element 64 and the FBAR 12' can include piezoelectric layers of different material. The piezoelectric layer 15''' can have a different shape than piezoelectric layers in other embodiments that have different resonator combinations. The Lamb wave element 64 and the FBAR 12' can be disposed on a common substrate 19. The substrate 19 can be a semiconductor substrate. For example, the substrate 19 can be a semiconductor substrate. The substrate 19 can be any other suitable substrate, such as a quartz substrate, a sapphire substrate, or a spinel substrate.

Figure 7:
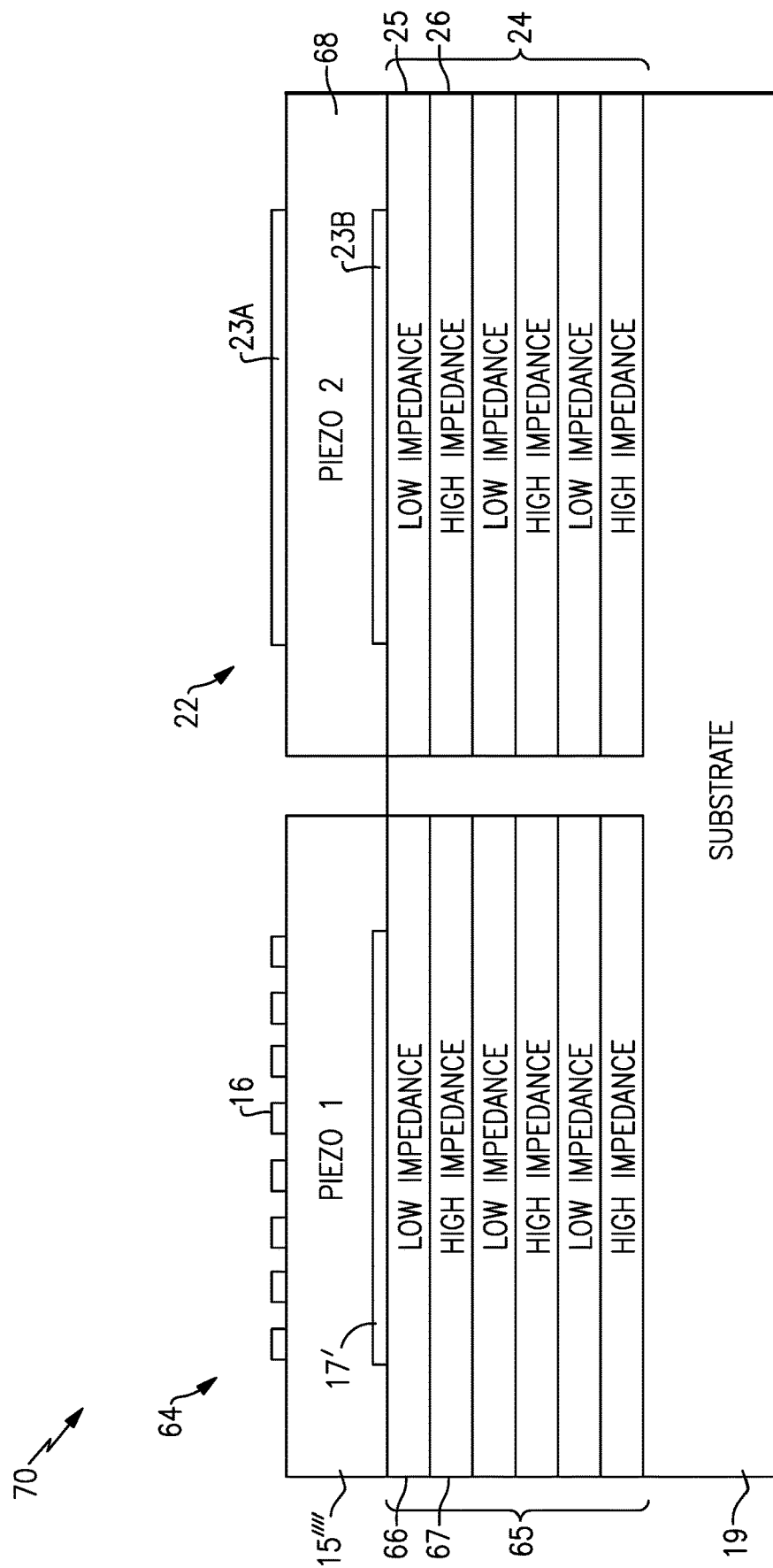
FIG. 7 is a diagram of cross section of an acoustic wave device that includes a solidly mounted Lamb wave element and an SMR on a common substrate according to an embodiment.

FIG. 7 is a diagram of cross section of an acoustic wave device 70 that includes a solidly mounted Lamb wave element 64 and an SMR 22 according to an embodiment. In the acoustic wave device 70, the SMR 22 and the Lamb wave element 64 are implemented on a common substrate 19. The SMR 22 can be included in an acoustic wave filter and the Lamb wave element 64 can be included in a loop circuit. The solidly mounted Lamb wave element 64 is structurally similar to the SMR 22, except that the solidly mounted Lamb wave element 64 includes an IDT electrode 16 and the SMR 22 includes an electrode 13A having a different shape than the IDT electrode 16 over the piezoelectric layer 15''''. The Bragg reflectors 65 for the solidly mounted Lamb wave element 64 and the Bragg reflectors 24 for the SMR 22 can be separated by material of the substrate 19. For instance, semiconductor material of a semiconductor substrate 19 can separate Bragg reflectors 24 from Bragg reflectors 65. The Bragg reflectors 65 and 24 can include the same materials in certain applications. The Bragg reflectors 65 and 24 can include different materials in certain applications. In some applications, Bragg reflectors can form a common acoustic mirror below the Lamb wave element 64 and the SMR 22. The piezoelectric layers 15''' and 68 of the solidly mounted Lamb wave element 64 and the SMR 22, respectively, can include the same piezoelectric material in certain applications. The piezoelectric layers 15''' and 68 of the solidly mounted Lamb wave element 64 and the SMR 22, respectively, can include different piezoelectric material in various applications.

Figure 8:
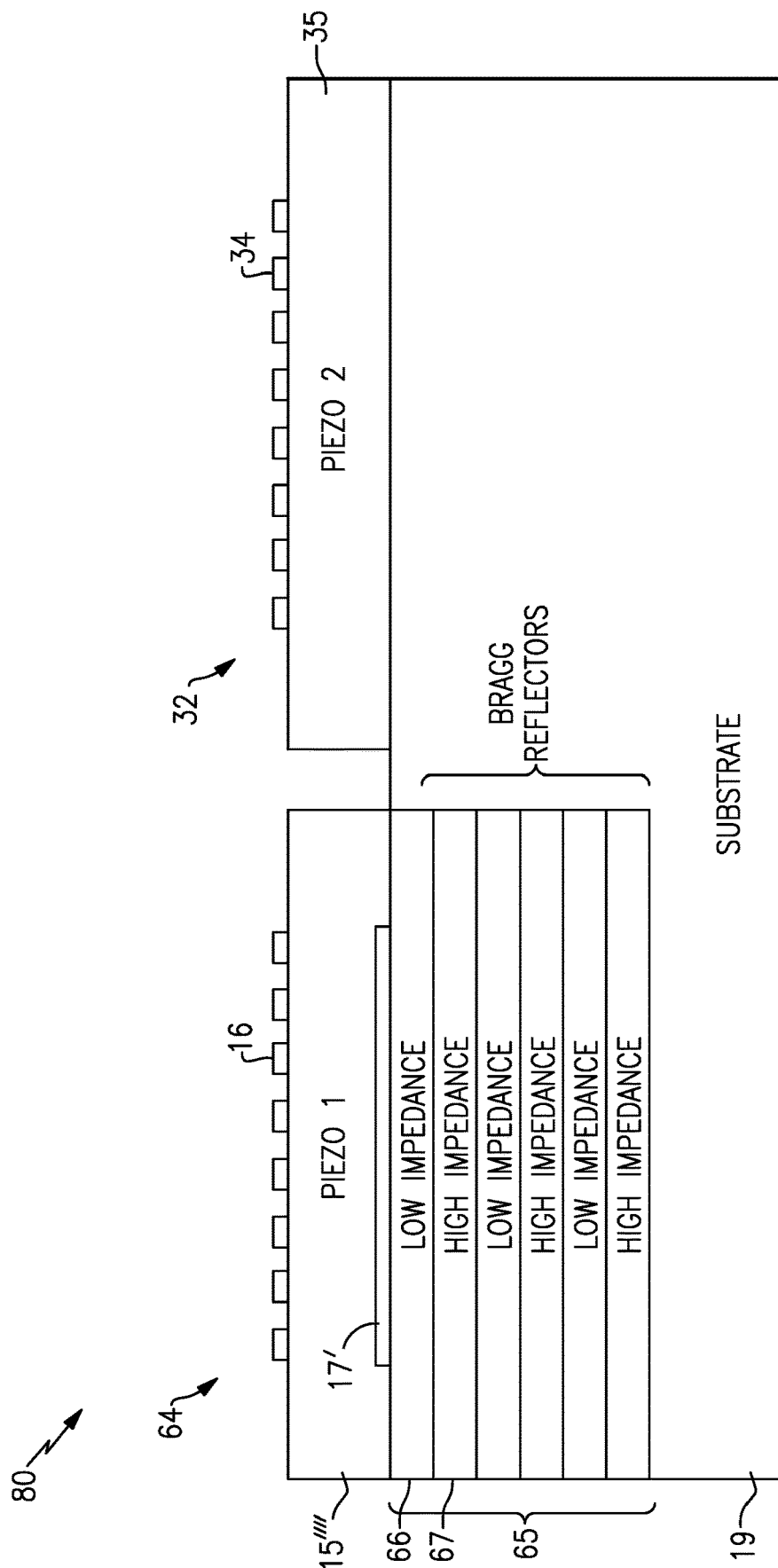
FIG. 8 is a diagram of cross section of an acoustic wave device that includes a solidly mounted Lamb wave element and a SAW resonator on a common substrate according to an embodiment.

FIG. 8 is a diagram of cross section of an acoustic wave device 80 that includes a solidly mounted Lamb wave element 64 and a SAW resonator 32 according to an embodiment. The solidly mounted Lamb wave element 64 and the SAW resonator 32 can be on a common substrate 19. The SAW resonator 32 can be included in an acoustic wave filter and the Lamb wave element 64 can be included in a loop circuit. The piezoelectric layers 15'''' and 35 of the solidly mounted Lamb wave element 64 and the SAW resonator 32, respectively, can include the same piezoelectric material in certain applications. The piezoelectric layers 15'''' and 35 of the solidly mounted Lamb wave element 64 and the SAW resonator 32, respectively, can include different piezoelectric material in various applications.

Figure 9:
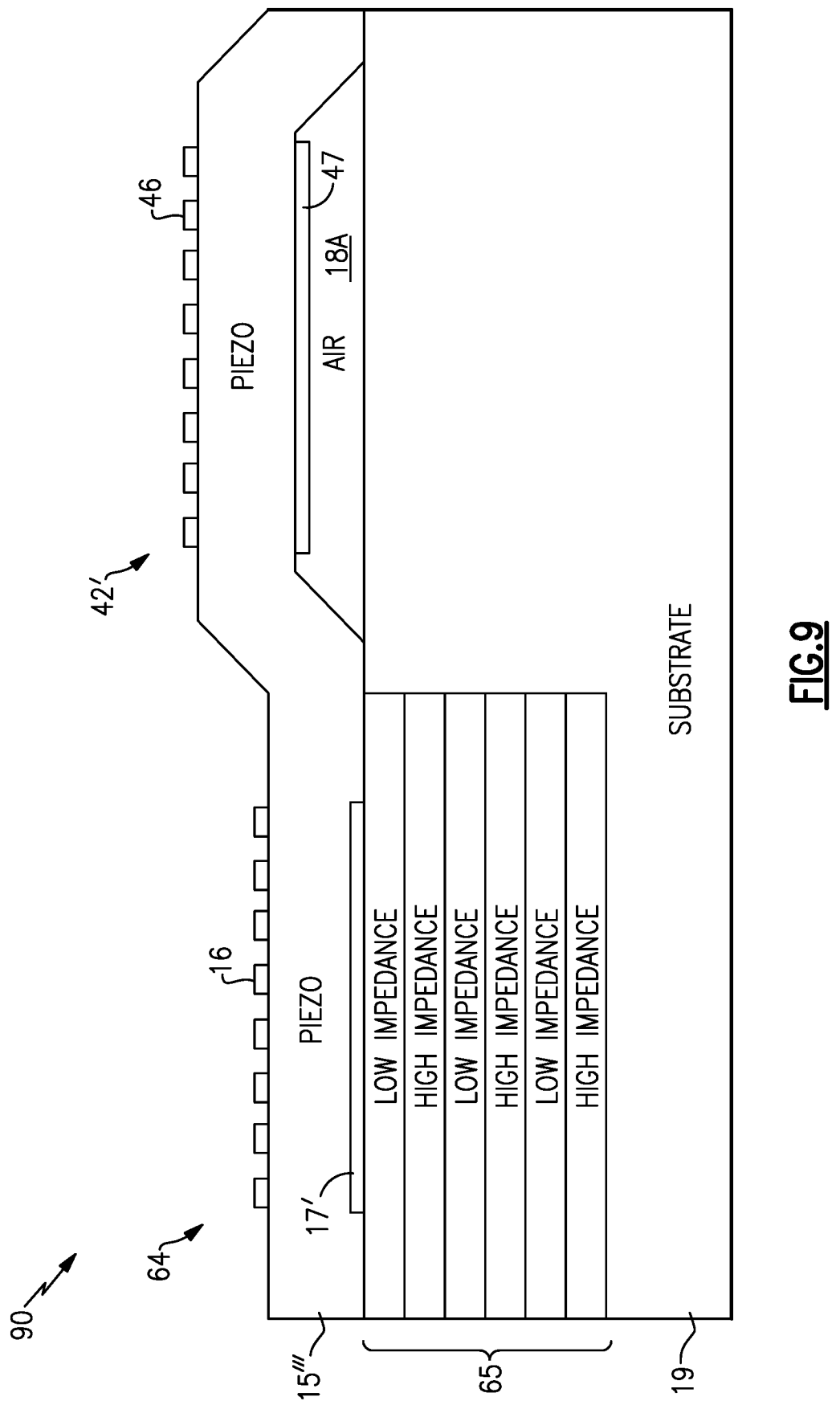
FIG. 9 is a diagram of cross section of an acoustic wave device that includes a solidly mounted Lamb wave element and a Lamb wave resonator on a common substrate according to an embodiment.

FIG. 9 is a diagram of cross section of an acoustic wave device 90 that includes a solidly mounted Lamb wave element 64 of and a Lamb wave resonator 42' according to an embodiment. The Lamb wave resonator 42' is a free-standing Lamb wave resonator. The solidly mounted Lamb wave element 64 and the Lamb wave resonator 42' can include the same piezoelectric material, such as aluminum nitride, lithium niobate, or lithium tantalate. In some other applications, the solidly mounted Lamb wave element 64 and the Lamb wave resonator 42' can include piezoelectric layers of different material. The solidly mounted Lamb wave element 64 and the Lamb wave resonator 42' can be disposed on a common substrate 19. The Lamb wave resonator 42' can be included in an acoustic wave filter and the Lamb wave element 64 can be included in a loop circuit.

Figure 10:
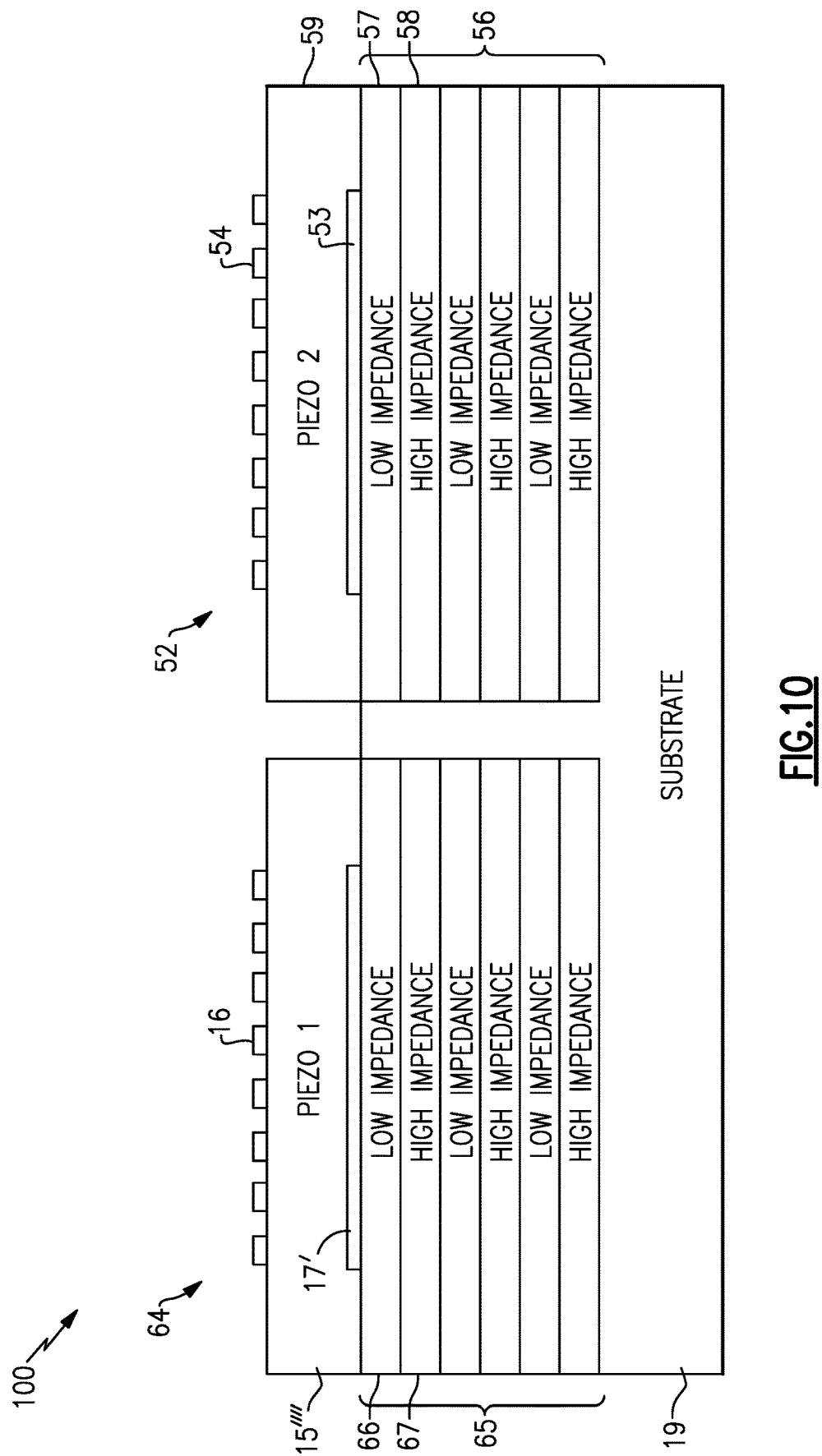
FIG. 10 is a diagram of cross section of an acoustic wave device that includes a solidly mounted Lamb wave element and a solidly mounted Lamb wave resonator on a common substrate according to an embodiment.

FIG. 10 is a diagram of cross section of an acoustic wave device 100 that includes a solidly mounted Lamb wave element 64 and a solidly mounted Lamb wave resonator 52 according to an embodiment. These solidly mounted Lamb wave elements can be structurally similar or the same. In the acoustic wave device 100, the solidly mounted Lamb wave resonator 52 and the Lamb wave element 64 are implemented on a common substrate 19. The solidly mounted Lamb wave resonator 52 can be included in an acoustic wave filter and the Lamb wave element 64 can be included in a loop circuit. Semiconductor material of the semiconductor substrate 19 can separate Bragg reflectors of these solidly mounted Lamb wave elements. The Bragg reflectors 65 and 56 can include the same materials in certain applications. The Bragg reflectors 65 and 56 can include different materials in certain applications. In some applications, Bragg reflectors can form a common acoustic mirror below the Lamb wave element 64 and the solidly mounted Lamb wave resonator 52. The piezoelectric layers 15''' and 59 of the solidly mounted Lamb wave element 64 and the solidly mounted Lamb wave resonator 52, respectively, can include the same piezoelectric material in certain applications. The piezoelectric layers 15''' and 68 of the solidly mounted Lamb wave element 64 and the solidly mounted Lamb wave resonator 52, respectively, can include different piezoelectric material in various applications.

Lamb wave elements can include an IDT electrode on a piezoelectric layer and reflective gratings disposed on the piezoelectric layer on opposing sides of the IDT electrode. The reflective gratings can reflect acoustic waves induced by the IDT electrode to form a resonant cavity. The reflective gratings can include a periodic pattern of metal on a piezoelectric layer. FIGS. 11A to 11F are diagrams of cross sections of Lamb wave elements with gratings. A Lamb wave element in a loop circuit can be implemented with any suitable principles and advantages of any of the Lamb wave elements of FIGS. 11A to 11F. A Lamb wave resonator in a filter can be implemented with any suitable principles and advantages of any of the Lamb wave elements of FIGS. 11A to 11F. Although the Lamb wave elements of FIGS. 11A to 11F are free-standing resonators, any suitable principles and advantages of these Lamb wave resonators can be applied to any other suitable Lamb wave elements.

FIG. 11A illustrates a Lamb wave element 110 that includes an IDT electrode 112, gratings 113 and 114, a piezoelectric layer 115, and an electrode 116. The IDT electrode 112 is on the piezoelectric layer 115. In the illustrated cross section, alternate ground and signal metals are included in the IDT electrodes. Gratings 113 and 115 are on the piezoelectric layer 115 and disposed on opposing sides of the IDT electrodes 112. The illustrated gratings 113 and 115 are shown as being connected to ground. Alternatively, one or more of the gratings can be signaled and/or floating. The electrode 116 and the IDT electrode 112 are on opposite sides of the piezoelectric layer 115. The piezoelectric layer 115 can be aluminum nitride, for example. The electrode 116 can be grounded.

FIG. 11B illustrates a Lamb wave element 110'. The Lamb wave element 110' is like the Lamb wave element 110 of FIG. 11A except that the Lamb wave element 110' includes a floating electrode 116'.

FIG. 11C illustrates a Lamb wave element 110" without an electrode on a side of the piezoelectric layer 115 that opposes the IDT electrode 112. The Lamb wave element 110" is otherwise like the Lamb wave element 110 of FIG. 11A.

FIG. 11D illustrates a Lamb wave element 110''' that includes an IDT electrode 117 and gratings 118 and 119 on a second side of the piezoelectric layer 115 that is opposite to a first side on which the IDT electrode 112 and gratings 113 and 114 are disposed. The signal and ground electrodes are offset relative to each other for the IDT electrodes 112 and 117.

FIG. 11E illustrates a Lamb wave element 110'''' that includes an IDT electrode 117' and gratings 118 and 119 on a second side of the piezoelectric layer 115 that is opposite to a first side on which the IDT electrode 112 and gratings 113 and 114 are disposed. The signal and ground electrodes are aligned with each other for the IDT electrodes 112 and 117'.

FIG. 11F illustrates a Lamb wave element 110''''' that includes an IDT electrode 117" and gratings 118 and 119 on a second side of the piezoelectric layer 115 that is opposite to a first side on which the IDT electrode 112' and gratings 113 and 114 are disposed. In the illustrated cross section, the IDT 112' includes only signal electrodes and the IDT electrode 117" includes only ground electrodes.

Lamb wave elements can include an IDT electrode with free edges. Suspended free edges of a piezoelectric layer can provide acoustic wave reflection to form a resonant cavity. FIGS. 12A to 12F are diagrams of cross sections of Lamb wave elements with free edges. A Lamb wave element in a loop circuit can be implemented with any suitable principles and advantages of any of the Lamb wave elements of FIGS. 12A to 12F. A Lamb wave resonator in a filter can be implemented with any suitable principles and advantages of any of the Lamb wave elements of FIGS. 12A to 12F. Although the Lamb wave elements of FIGS. 12A to 12F are free-standing elements, any suitable principles and advantages of these Lamb wave elements can be applied to other Lamb wave elements.

FIG. 12A illustrates a Lamb wave element 120 that includes IDT electrode 112, piezoelectric layer 115, and an electrode 116. The IDT electrode 112 is on the piezoelectric layer 115. In the illustrated cross section, alternate ground and signal electrodes are included in the IDT electrodes. The piezoelectric layer 115 has free edges on opposing sides of the IDT electrode 112. The electrode 116 and the IDT electrode 112 are on opposite sides of the piezoelectric layer 115. The piezoelectric layer 115 can be aluminum nitride, for example. The electrode 116 can be grounded.

FIG. 12B illustrates a Lamb wave element 120'. The Lamb wave element 120' is like the Lamb wave element 120 of FIG. 12A except that the Lamb wave element 120' includes a floating electrode 116'.

FIG. 12C illustrates a Lamb wave element 120" without an electrode on a side of the piezoelectric layer 115 that opposes the IDT electrode 112. The Lamb wave element 120" is otherwise like the Lamb wave element 120 of FIG. 12A.

Figure 12D:
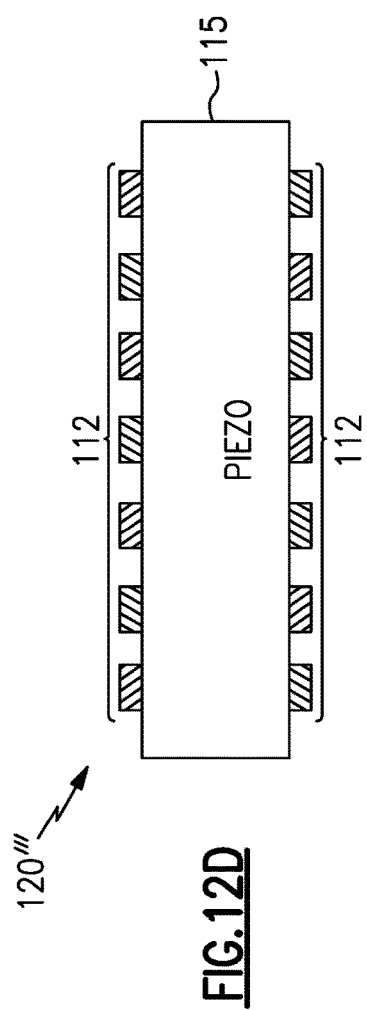

FIG. 12D illustrates a Lamb wave element 120''' that includes an IDT electrode 117 on a second side of the piezoelectric layer 115 that is opposite to a first side on which the IDT electrode 112 is disposed. The signal and ground electrodes are offset relative to each other for the IDT electrodes 112 and 117.

Figure 12E:
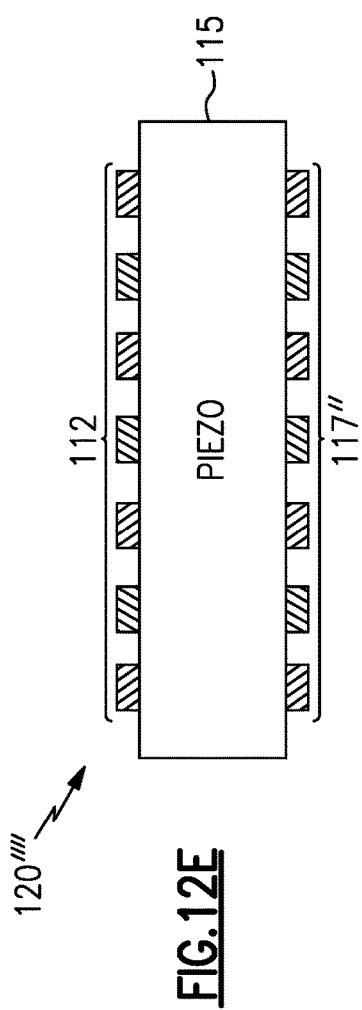

FIG. 12E illustrates a Lamb wave element 120'''' that includes an IDT electrode 117' on a second side of the piezoelectric layer 115 that is opposite to a first side on which the IDT electrode 112 is disposed. The signal and ground electrodes are aligned with each other for the IDT electrodes 112 and 117'.

Figure 12F:
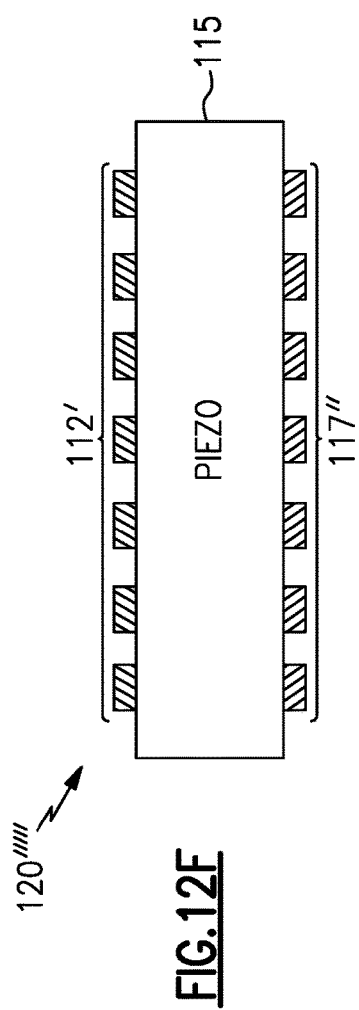

FIG. 12F illustrates a Lamb wave element 120''''' that includes an IDT electrode 117" on a second side of the piezoelectric layer 115 that is opposite to a first side on which the IDT electrode 112' is disposed. In the illustrated cross section, the IDT electrode 112' includes only signal electrodes and the IDT electrode 117" includes only ground electrodes.

The Lamb wave loop circuits discussed herein can be coupled to an acoustic wave filter. For instance, a Lamb wave element can be coupled to an acoustic wave filter of a duplexer or other multiplexer (e.g., a quadplexer, hexaplexer, octoplexer, etc.). FIGS. 13, 15, 17, and 19 are schematic diagrams that illustrate example duplexers that include a Lamb wave loop circuit coupled to an acoustic wave filter. Any suitable principles and advantages discussed with reference to and/or illustrated in FIGS. 1A to 12F can be applied to any of the example duplexers of FIGS. 13, 15, 17, and 19. Any suitable principles and advantages of the embodiments of FIGS. 13, 15, 17, and 19 can be implemented together with each other.

Figure 13:
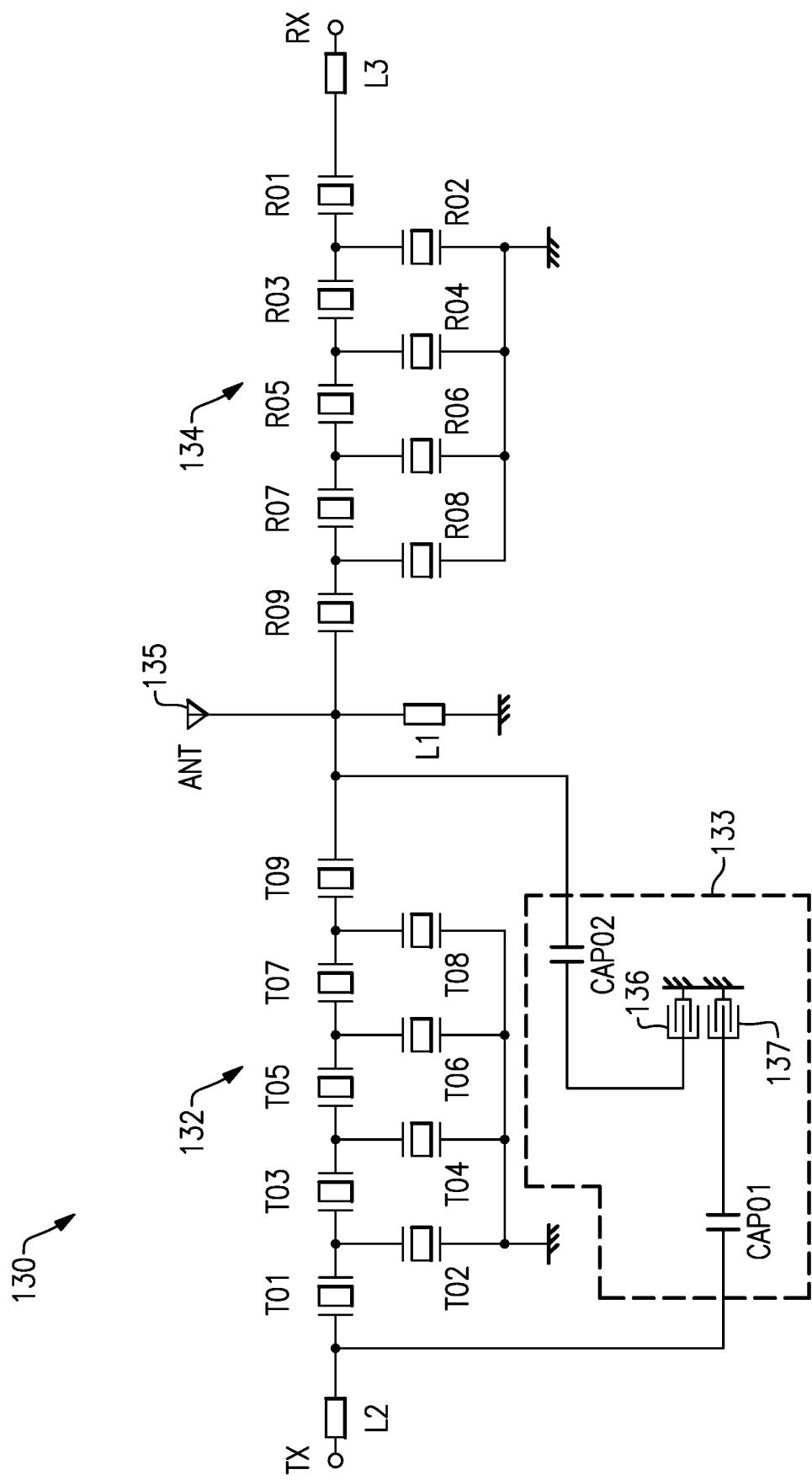
FIG. 13 is a schematic diagram of a duplexer with a loop circuit for a transmit filter according to an embodiment.

FIG. 13 is a schematic diagram of a duplexer 130 with a loop circuit 133 for a transmit filter 132. The duplexer 130 includes a transmit filter 132, a receive filter 134, and a loop circuit 133. The transmit filter 132 and the receive filter 134 are coupled together at a common node, which is an antenna node in FIG. 13. An antenna 135 is coupled to the common node of the duplexer 130. A shunt inductor L1 can be coupled between the antenna 135 and ground.

The transmit filter 132 can filter an RF signal received at the transmit port TX for transmission via the antenna 135. A series inductor L2 can be coupled between the transmit port TX and acoustic wave resonators of the transmit filter 132. The transmit filter 132 is an acoustic wave filter that includes acoustic wave resonators arranged as a ladder filter. The transmit filter 132 includes series resonators T01, T03, T05, T07, T09 and shunt resonators T02, T04, T06, T08. The transmit filter 132 can include any suitable number of series resonators and any suitable number of shunt resonators. The acoustic wave resonators of the transmit filter 132 can include BAW resonators, such as FBARs and/or SMRs. In some instances, the acoustic wave resonators of the transmit filter 132 can include SAW resonators or Lamb wave resonators. In certain applications, the resonators of the transmit filter 132 can include two or more types of resonators (e.g., one or more SAW resonators and one or more BAW resonators).

A loop circuit 133 is coupled to the transmit filter 132. The loop circuit 133 can be coupled to an input resonator T01 and an output resonator T09 of the transmit filter. In some other instances, the loop circuit 133 can be coupled to a different node of the ladder circuit than illustrated. The loop circuit 133 can apply a signal having approximately the same amplitude and an opposite phase to a signal component to be canceled. The loop circuit 133 includes Lamb wave elements 136 and 137 coupled to the transmit filter 132 by capacitors CAP02 and CAP01, respectively. The Lamb wave elements 136 and 137 can together correspond to any suitable Lamb wave element disclosed herein. For example, the Lamb wave elements 136 and 137 can together correspond to the Lamb wave element 14 of FIG. 1A, in which each Lamb wave element 136 and 137 corresponds to a different IDT electrode of the Lamb wave element 14. In this example, the transmit filter 132 can include an FBAR implemented on the same substrate of a die as the Lamb wave element 14. The capacitors CAP01 and CAP02 are example attenuation elements that can coupled the transmit filter 132 to the loop circuit 133. In various applications, an attenuation element can include a resistor, an inductor, a capacitor, or any suitable combination thereof. Any suitable principles and advantages of the Lamb wave elements of a loop circuit discussed herein can be implemented in the loop circuit 133. The loop circuit 133 can be implemented in accordance with any suitable principles and advantages described in U.S. Pat. Nos. 9,246,533 and/or 9,520,857, the disclosures of these patents are hereby incorporated by reference in their entireties herein.

The receive filter 134 can filter a received RF signal received by the antenna 135 and provide a filtered RF signal to a receive port RX. The receive filter 134 is an acoustic wave filter that includes acoustic wave resonators arranged as a ladder filter. The receive filter 134 includes series resonators R01, R03, R05, R07, R09 and shunt resonators R02, R04, R06, R08. The receive filter 134 can include any suitable number of series resonators and any suitable number of shunt resonators. The acoustic wave resonators of the receive filter 134 can include BAW resonators, such as FBARs and/or SMRs. In some instances, the acoustic wave resonators of the receive filter 134 can include SAW resonators or Lamb wave resonators. In certain applications, the resonators of the receive filter 134 can include two or more types of resonators (e.g., one or more SAW resonators and one or more BAW resonators). A series inductor L3 can be coupled between the acoustic wave resonators of the receive filter 134 and the receive port RX.

Figure 14:
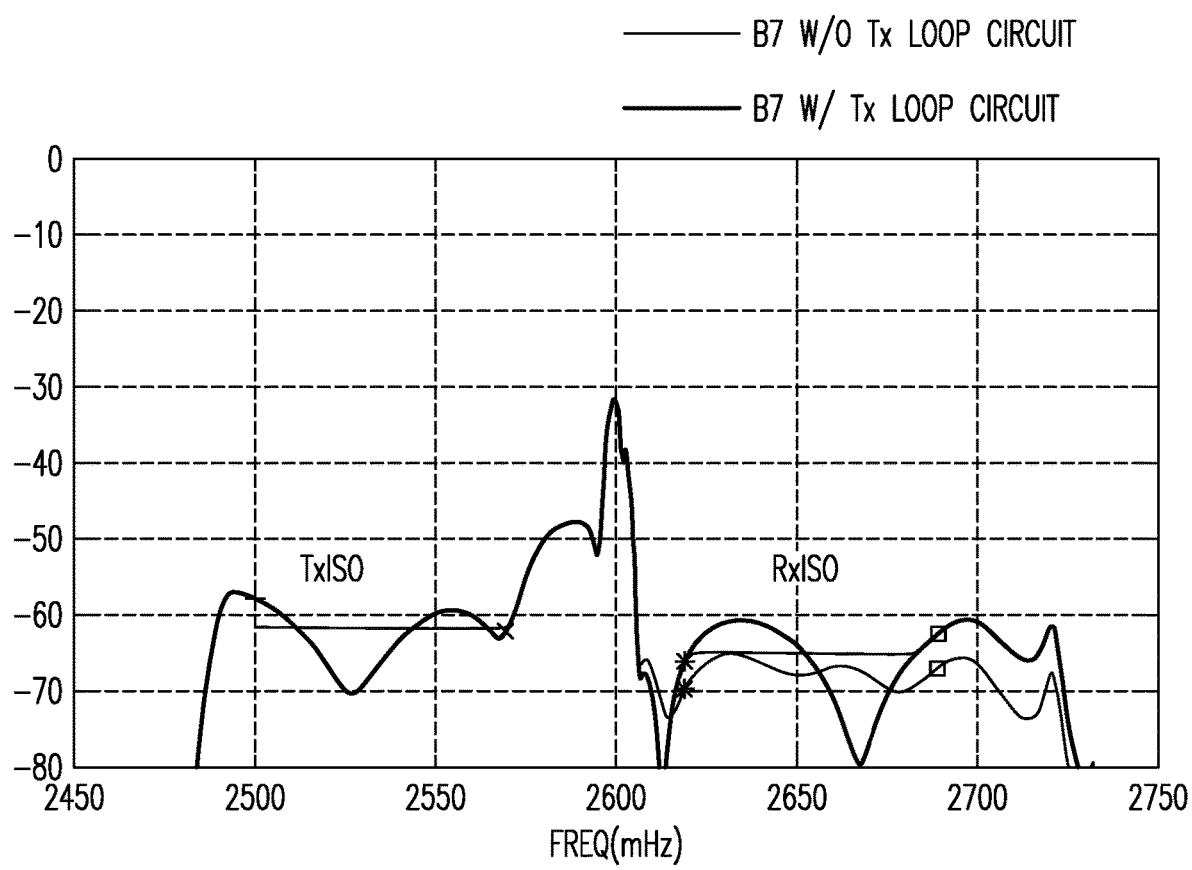
FIG. 14 is a graph comparing isolation for the duplexer of FIG. 13 to a corresponding duplexer without a loop circuit.

FIG. 14 is a graph comparing isolation for the duplexer 130 of FIG. 13 to a corresponding duplexer without a loop circuit. The acoustic wave properties of the lowest-order symmetric ($S_0$) Lamb wave mode for a Lamb wave resonator with an aluminum nitride piezoelectric layer were used to study the loop circuits for BAW filters. The Lamb wave $S_0$ mode for such a resonator in the simulations was assumed to have a velocity of ~9000 m/s and a $K^2$ of ~2%. A Band 7 BAW duplexer was used in the simulations. The graph in FIG. 14 indicates that the loop circuit 133 improves receive isolation. The improvement can be about 5 decibels (dB) in certain instances as indicated by FIG. 14.

Figure 15:
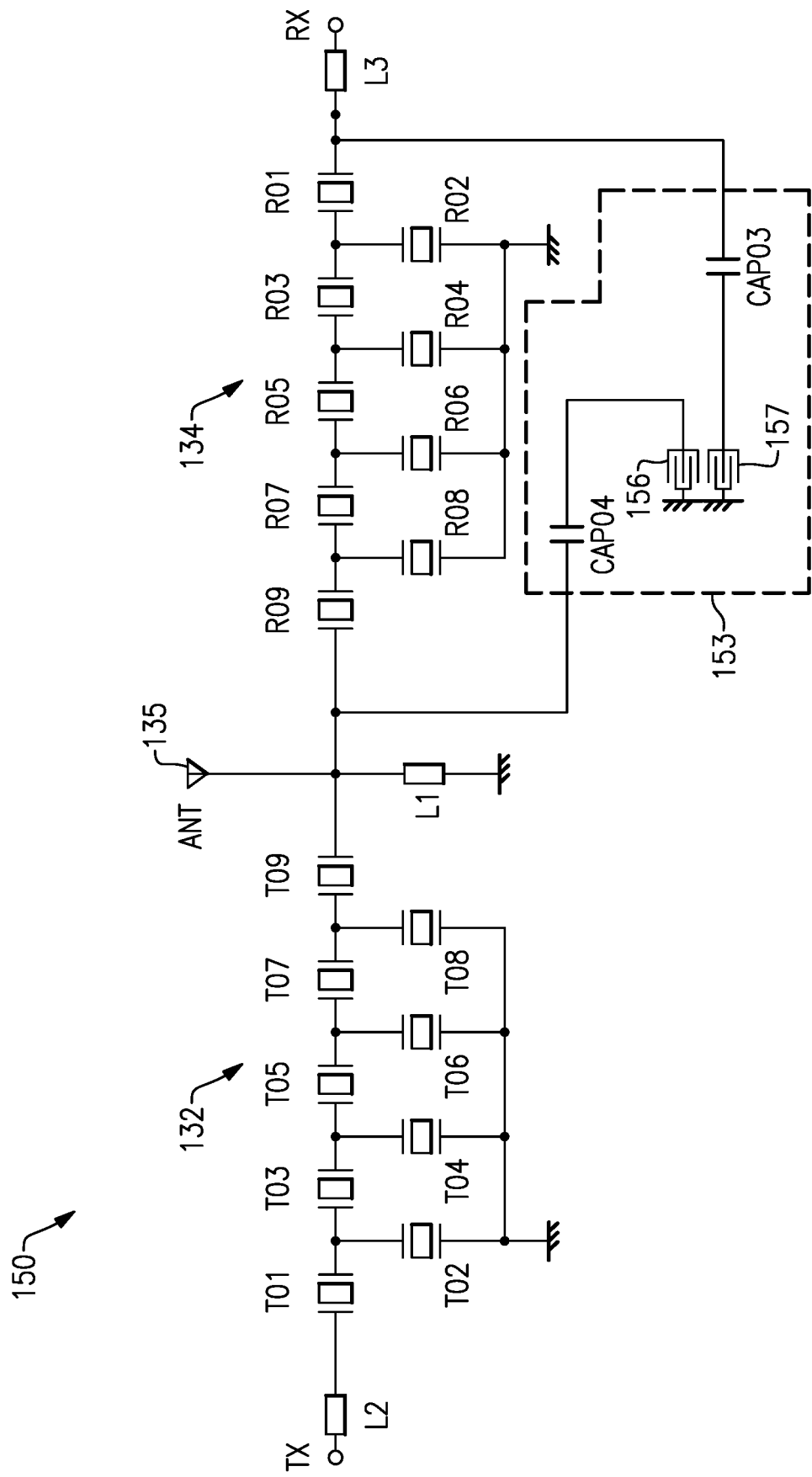
FIG. 15 is a schematic diagram of a duplexer with a loop circuit for a receive filter according to an embodiment.

FIG. 15 is a schematic diagram of a duplexer 150 with a loop circuit for a receive filter 134. The duplexer 150 is like the duplexer 130 of FIG. 13, except that the duplexer 150 includes a loop circuit 153 for the receive filter 134. A loop circuit 153 is coupled to the receive filter 134. The loop circuit 153 can be coupled to an input resonator R09 and an output resonator R01 of the receive filter 134. In some other instances, the loop circuit 153 can be coupled to a different node of the ladder circuit of the receive filter 134 than illustrated. The loop circuit 153 includes Lamb wave elements 156 and 157 coupled to the receive filter 134 by capacitors CAP04 and CAP03, respectively. Any suitable principles and advantages of the Lamb wave elements of a loop circuit discussed herein can be implemented in the loop circuit 153. For example, the Lamb wave elements 156 and 157 can together correspond to the Lamb wave element 14 of FIG. 14A.

Figure 16A:
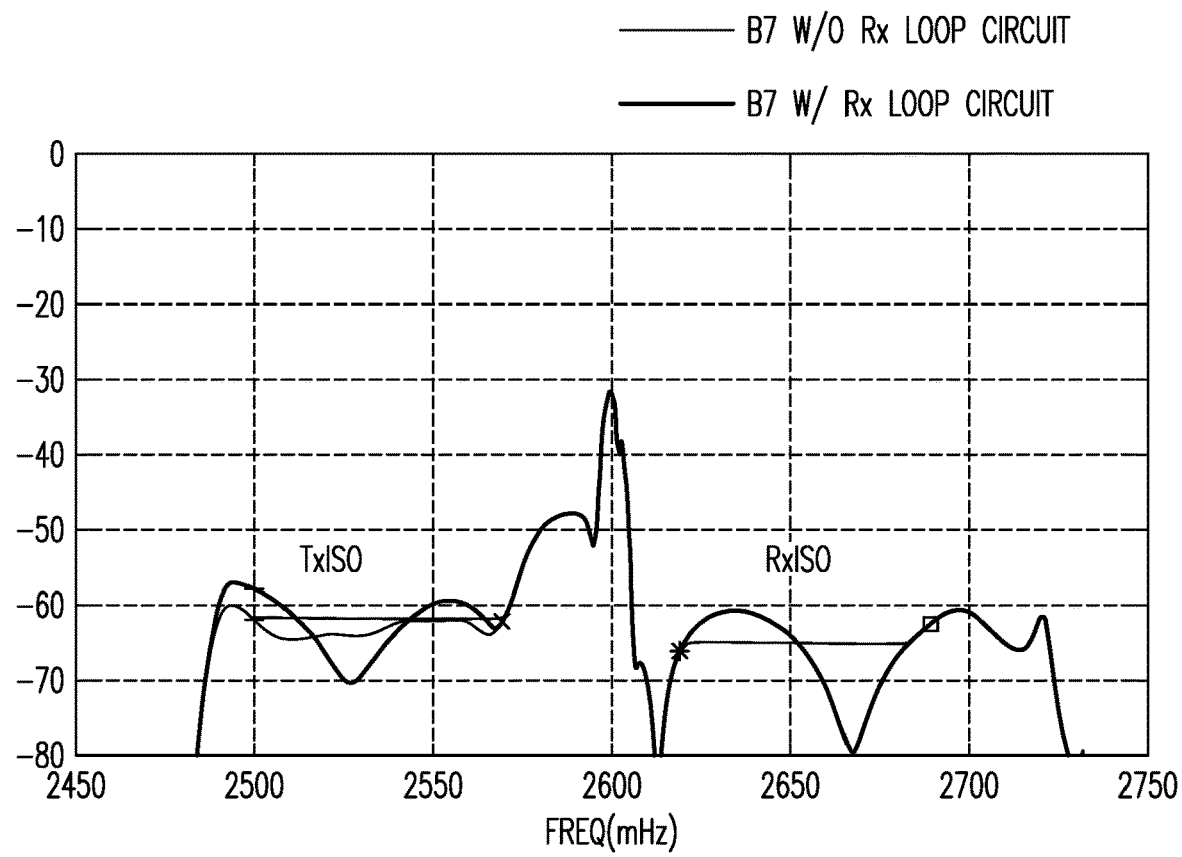
FIG. 16A is a graph comparing isolation for the duplexer of FIG. 15 to a corresponding duplexer without a loop circuit.

FIG. 16A is a graph comparing isolation for the duplexer 150 of FIG. 15 to a corresponding duplexer without a loop circuit. The same simulation assumptions were used to generate the graphs of FIG. 16A and FIG. 16B as for generating the graph of FIG. 14. The graph of FIG. 16A indicates that the loop circuit 153 improves transmit isolation.

Figure 16B:
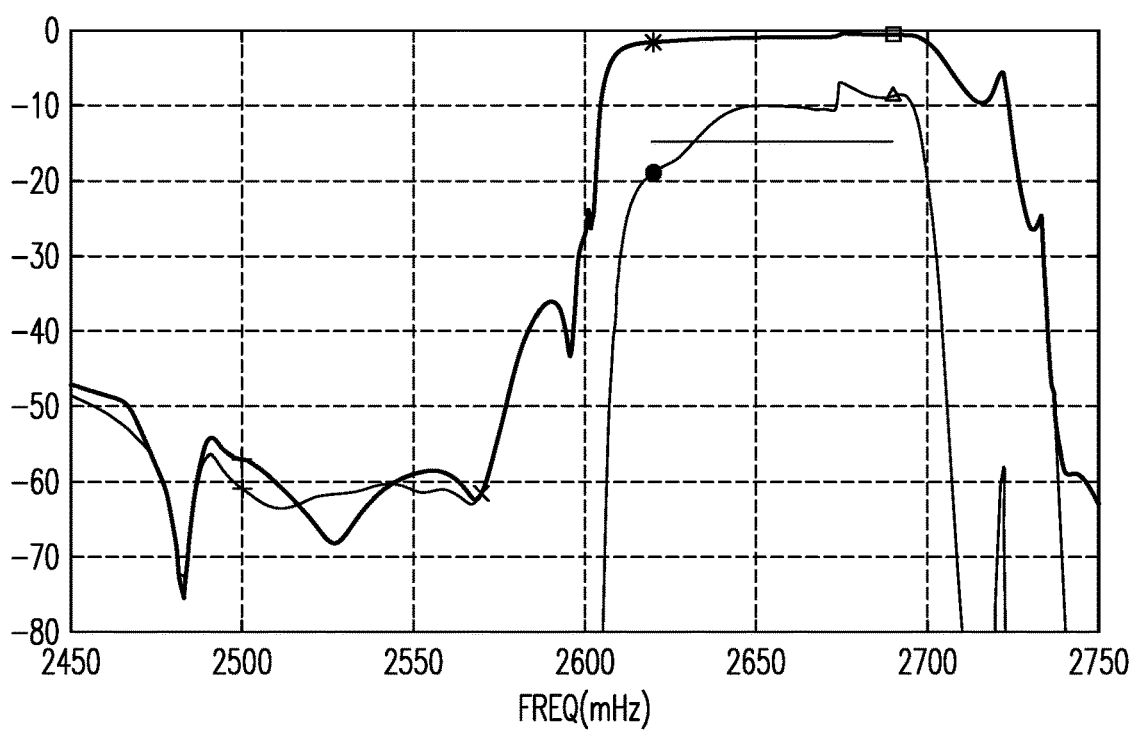
FIG. 16B is a graph comparing receive band rejection for the duplexer of FIG. 15 to a corresponding duplexer without a loop circuit.

FIG. 16B is a graph comparing receive band rejection for the duplexer 150 of FIG. 15 to a corresponding duplexer without a loop circuit. This graph illustrates that the loop circuit 153 can suppress rejection at a lower frequency range for the receive band.

Figure 17:
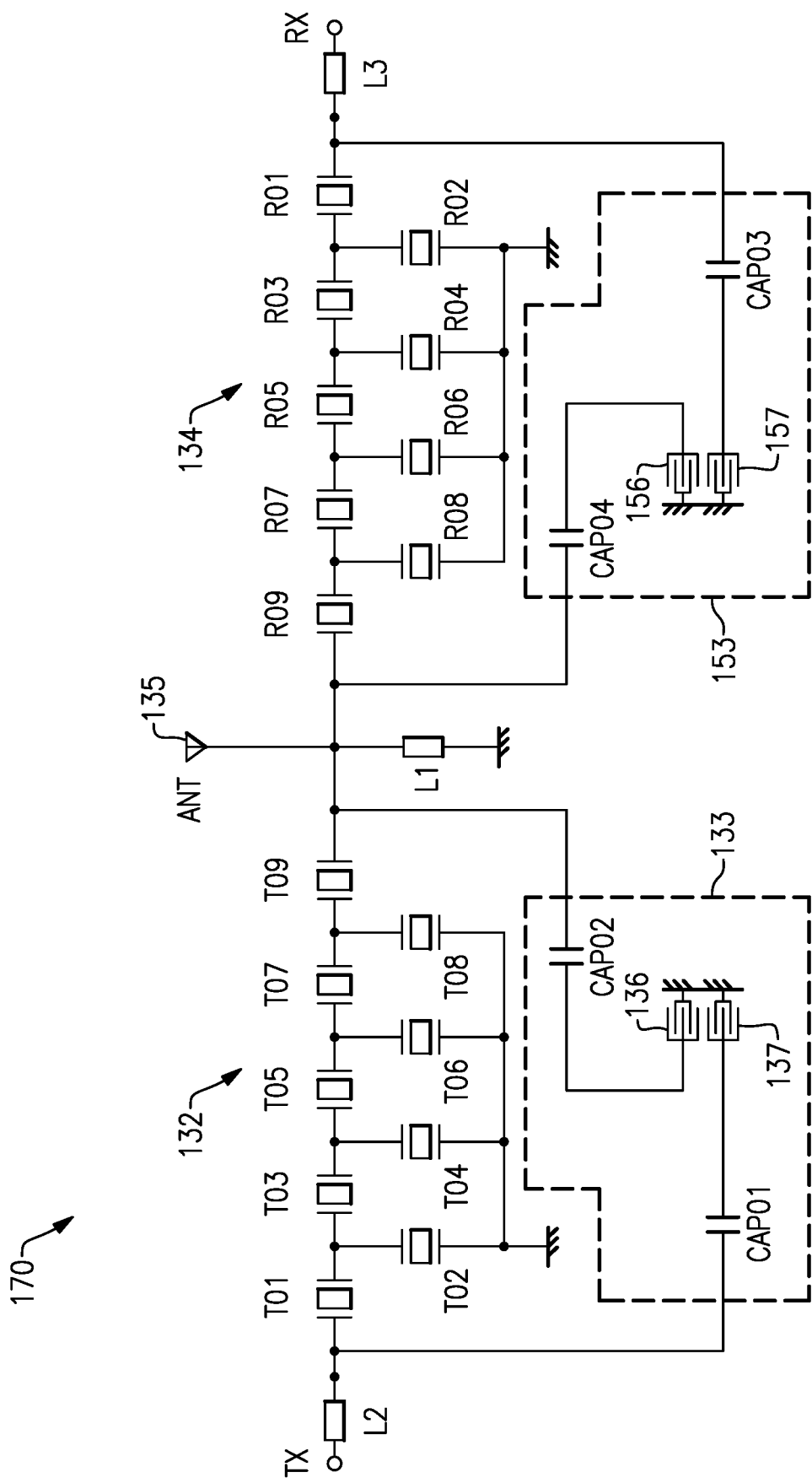
FIG. 17 is a schematic diagram of a duplexer with a first loop circuit for a transmit filter and a second loop circuit for a receive filter according to an embodiment.

FIG. 17 is a schematic diagram of a duplexer 170 with a first loop circuit 133 for a transmit filter 132 and a second loop circuit 153 for a receive filter 134. FIG. 17 illustrates that separate loop circuits can be implemented for a transmit filter and a receive filter. A loop circuit can be implemented for an acoustic wave filter to bring the parameter of the acoustic wave filter within a specification. For example, a loop circuit can be implemented to bring isolation of an acoustic wave filter to be less than −60 dB to meet a specification for isolation if the acoustic wave filter would not otherwise meet the specification for isolation.

Figure 18:
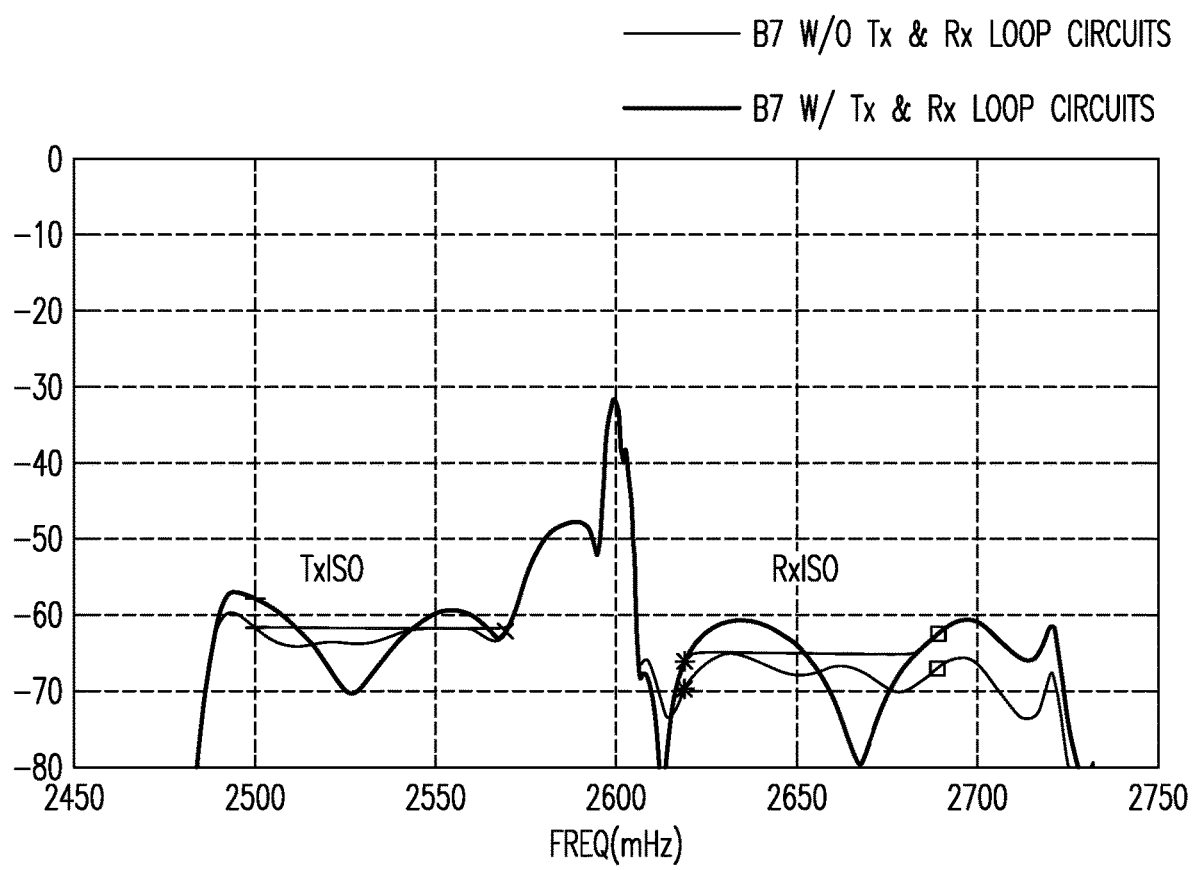
FIG. 18 is a graph comparing isolation for the duplexer of FIG. 17 to a corresponding duplexer without loop circuits.

FIG. 18 is a graph comparing isolation for the duplexer 170 of FIG. 17 to a corresponding duplexer without loop circuits. This graph indicates that the loop circuits 133 and 153 of the duplexer 170 improve both transmit and receive isolation.

Figure 19:
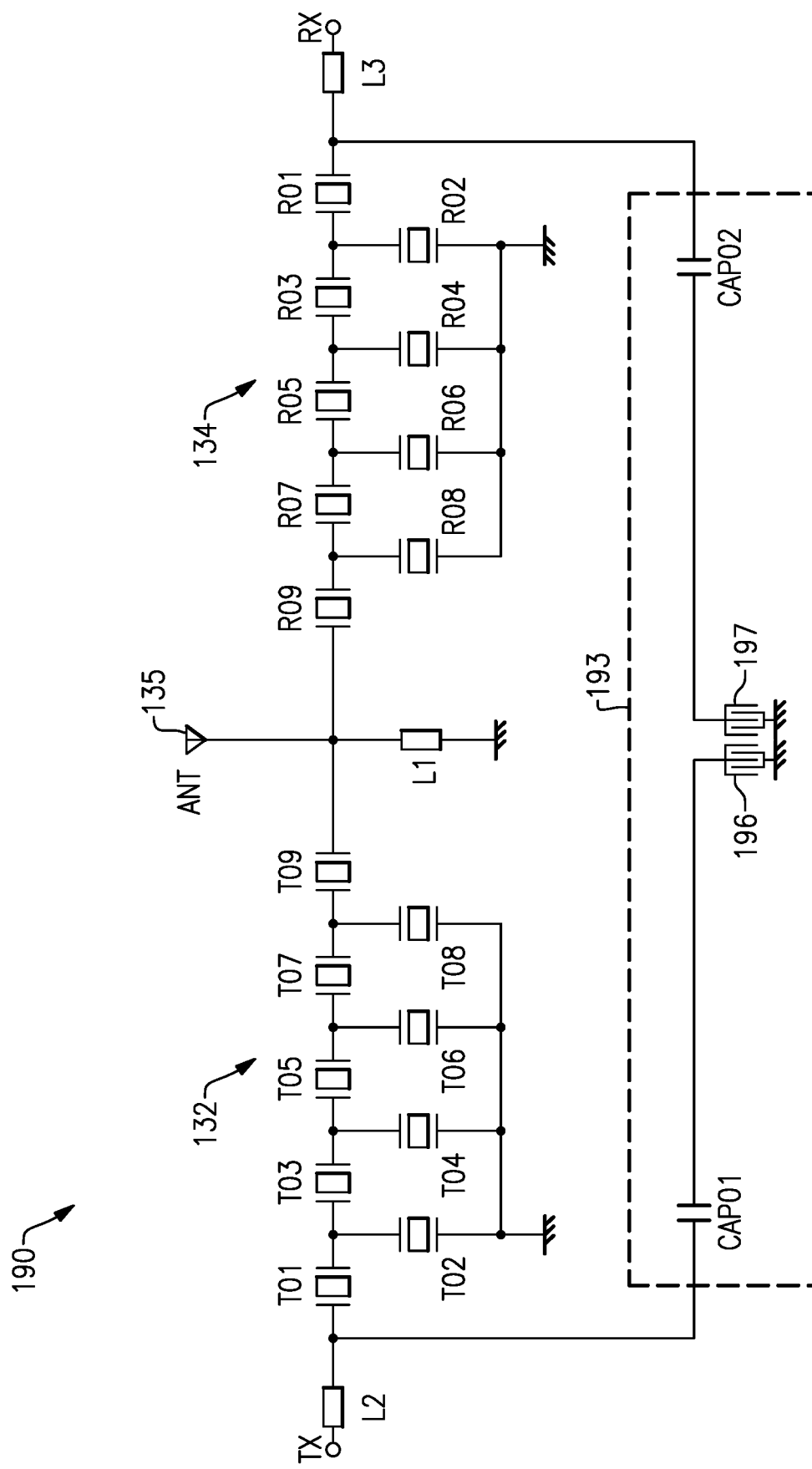
FIG. 19 is a schematic diagram of a duplexer with a loop circuit coupled between a transmit port of a transmit filter and a receive port of a receive filter according to an embodiment.

FIG. 19 is a schematic diagram of a duplexer 190 with a loop circuit 193. The duplexer 190 is like the duplexer 130 of FIG. 13, except that the duplexer 190 includes a loop circuit 193 that is coupled across the transmit filter 132 and the receive filter 134. The loop circuit 193 is coupled to the receive port RX and the transmit port TX. In some other instances, the loop circuit 193 can be coupled to a different node of the ladder circuit of the receive filter 134 and/or a different node of the transmit filter 132 than illustrated. The loop circuit 193 includes Lamb wave elements 196 and 197. The Lamb wave element 196 is coupled to the transmit filter by capacitor CAP01. The Lamb wave element 197 is coupled to the receive filter 134 by capacitor C02. Any other suitable attenuation element, such as a resistor or an inductor, can be implemented in place of or in addition to the capacitor C01 and/or the capacitor C02. Any suitable principles and advantages of the Lamb wave elements of a loop circuit discussed herein can be implemented in the loop circuit 193. For example, the Lamb wave elements 196 and 197 can together correspond to the Lamb wave element 14 of FIG. 14A.

Acoustic wave devices disclosed herein can be implemented in acoustic wave filters. Such acoustic wave filters can be band pass filters arranged to filter radio frequency signals including radio frequency signals at up to and including millimeter wave frequencies. In certain applications, an acoustic wave filter assembly can include a first filter that includes a Lamb wave resonator and a second filter that includes a different type of resonator, such as an FBAR. The first filter and the second filter can be included on a single die. A schematic diagram of an example acoustic wave filter assembly will be discussed with reference to FIG. 20. Although an acoustic wave filter assembly with two filters will be described for illustrative purposes, any suitable principles and advantages can be applied to acoustic wave filter assemblies with more than two filters.

Figure 20:
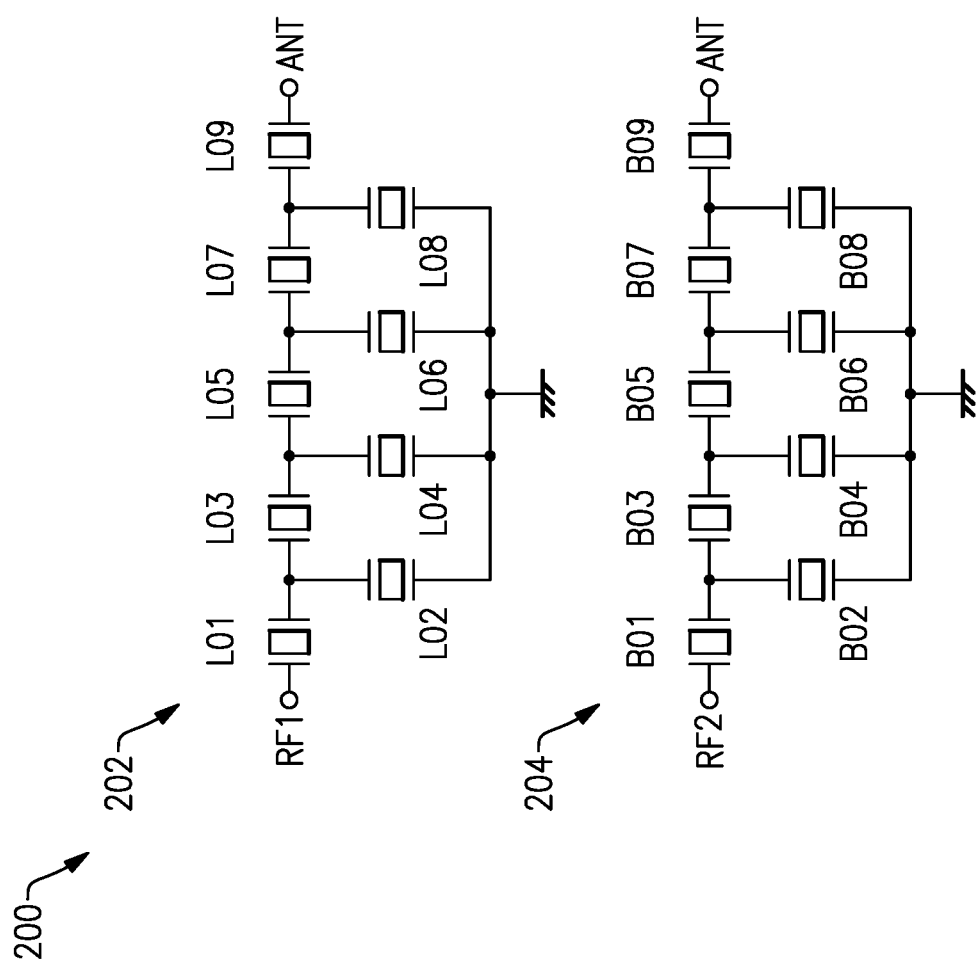
FIG. 20 is a schematic diagram of an acoustic wave filter assembly that includes a first filter with a Lamb wave resonator and a second filter with a different type of acoustic wave resonator, in which the Lamb wave resonator and the different type of resonator are implemented on the same substrate according to an embodiment.

FIG. 20 is a schematic diagram of an acoustic wave filter assembly 200 that includes a first filter 202 with a Lamb wave resonator and a second filter 204 with a different type of acoustic wave resonator, in which the Lamb wave resonator and the different type of resonator are implemented on the same substrate according to an embodiment. The acoustic wave filter assembly 200 can include any of the acoustic wave devices of FIGS. 1A to 10.

The first filter 202 includes Lamb wave resonators L01, L02, L03, L04, L05, L06, L07, L08, and L09 arranged as a ladder filter between an RF port RF1 and an antenna port ANT. The RF port RF1 can be a transmit port or a receive port. The first filter 202 is a band pass filter having a first pass band and arranged to filter a first RF signal.

The second filter 204 includes acoustic wave resonators B01, B02, B03, B04, B05, B06, B07, B08, and B09 arranged as a ladder filter between an RF port RF2 and an antenna port ANT. The RF port RF2 can be a transmit port or a receive port. The second filter 204 is a band pass filter having a second pass band and arranged to filter a second RF signal. The acoustic wave resonators B01 to B09 of the second filter 204 are a different type of acoustic wave resonators than the Lamb wave resonators L01 to L09 of the first filter 202. For example, the acoustic wave resonators B01 to B09 of the second filter 204 can be BAW resonators, such as FBARs.

Some or all of the Lamb wave resonators L01 to L09 of the first filter 202 can be implemented on the same substrate of die as some or all of the acoustic wave resonators B01 to B09 of the second filter 204. In certain instances, one or more resonators of the Lamb wave resonators L01 to L09 include a piezoelectric layer that includes the same material (e.g., aluminum nitride) as the piezoelectric layer of one or more of the acoustic wave resonators B01 to B09. In some applications, a multiplexer (e.g., a duplexer) can include the first filter 202 and the second filter 204 coupled together at a common node (e.g., the antenna node ANT).

Acoustic wave devices disclosed herein can be implemented in an acoustic wave filter that includes a Lamb wave resonator and a different type of acoustic wave resonator. Such an acoustic wave filter can include any suitable acoustic wave device disclosed herein. The acoustic wave filter can be band pass filters arranged to filter radio frequency signals. The Lamb wave resonator and the different type of acoustic wave resonator can be implemented on the same substrate of a die. The substrate can be a silicon substrate, for example. In some instances, the different type of acoustic wave resonator can be an FBAR. The different type of acoustic wave resonator and the Lamb wave resonator can include respective piezoelectric layer of the same piezoelectric material (for example, aluminum nitride) in certain applications. Example acoustic wave filters with a Lamb wave resonator and another type of acoustic wave resonator will be discussed with reference to FIGS. 21A to 21F. These example acoustic wave filters can achieve desirable performance and/or loading characteristics for certain applications. Any suitable principles and advantages of these acoustic wave filters can be implemented together with each other. Moreover, any of the example acoustic wave filters of FIGS. 21A to 21F can include an acoustic wave device in accordance with any suitable principles and advantages of FIGS. 1A to 10.

FIG. 21A is a schematic diagram of an acoustic wave filter 210 that includes series Lamb wave resonators and other shunt acoustic wave resonators according to an embodiment. The series Lamb wave resonators LS01, LS02, LS03, LS04, and LS05 and other shunt acoustic wave resonators BP01, BP02, BP03, BP04, and BP05 are arranged as a ladder filter coupled between an RF port RF and an antenna port ANT. The RF port RF can be a transmit port of a transmit filter. The RF port can be a receive port of a receive filter. Any suitable number of series resonators and any suitable number of shunt resonators can be included in the acoustic wave filter 210. The other shunt acoustic wave resonators BP01, BP02, BP03, BP04, and BP05 can be FBARs. In some other instances, the other shunt acoustic wave BP01, BP02, BP03, BP04, and BP05 can be SAW resonators or SMRs.

FIG. 21B is a schematic diagram of an acoustic wave filter 212 that includes shunt Lamb wave resonators and other series acoustic wave resonators according to an embodiment. The shunt Lamb wave resonators LP01, LP02, LP03, LP04, and LP05 and other series acoustic wave resonators BS01, BS02, BS03, BS04, and BS05 are arranged as a ladder filter coupled between an RF port RF and an antenna port ANT. The RF port RF can be a transmit port of a transmit filter. The RF port can be a receive port of a receive filter. Any suitable number of series resonators and any suitable number of shunt resonators can be included in the acoustic wave filter 212. The other series acoustic wave resonators BS01, BS02, BS03, BS04, and BS05 can be FBARs. In some other instances, the other shunt acoustic wave BS01, BS02, BS03, BS04, and BS05 can be SAW resonators or SMRs.

FIG. 21C is a schematic diagram of an acoustic wave filter 214 that includes a series Lamb wave resonator LS and other acoustic wave resonators B01 to B08 coupled to an antenna port ANT via the series Lamb wave resonator LS according to an embodiment. The other acoustic wave resonators B01 to B08 can be SAW resonators or BAW resonators.

FIG. 21D is a schematic diagram of an acoustic wave filter 216 that includes a series Lamb wave resonator LS and other acoustic wave resonators B02 to B09 coupled to a radio frequency port RF via the series Lamb wave resonator LS according to an embodiment. The other acoustic wave resonators B02 to B09 can be SAW resonators or BAW resonators.

Figures 21E, 21F:
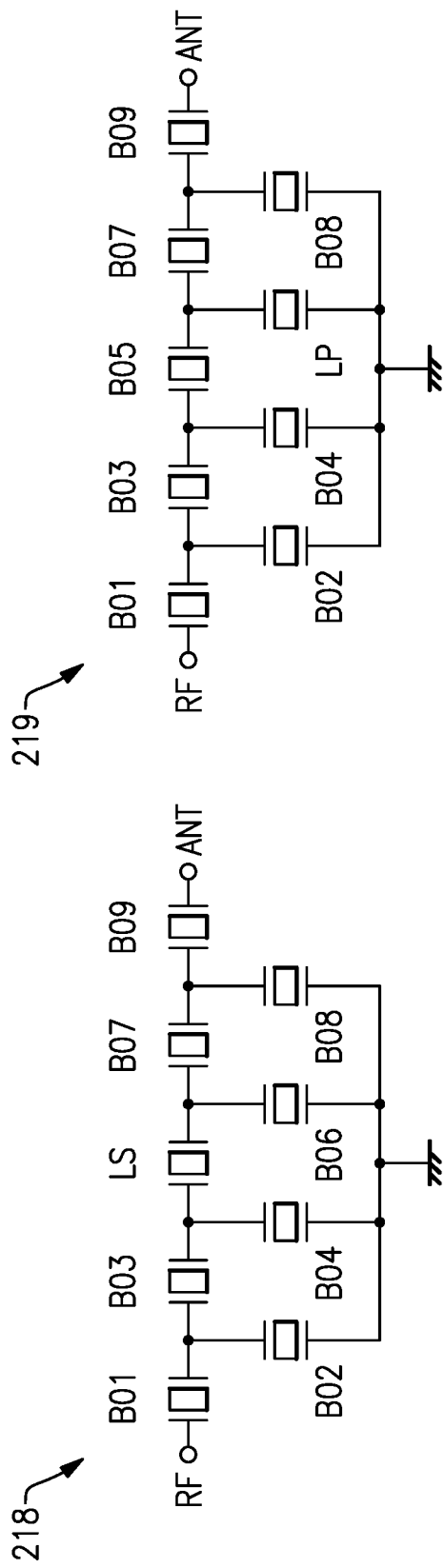
FIG. 21E is a schematic diagram of an acoustic wave filter that includes a series Lamb wave resonator and other acoustic wave resonators according to an embodiment.
FIG. 21F is a schematic diagram of an acoustic wave filter that includes a shunt Lamb wave resonator and other acoustic wave resonators according to an embodiment.

FIG. 21E is a schematic diagram of an acoustic wave filter 218 that includes a series Lamb wave resonator LS and other acoustic wave resonators B01 to B04 and B06 to B09 according to an embodiment. In the acoustic wave filter 218, a first other series resonator B01 is coupled between the series Lamb wave resonator LS and the RF port RF. A second other series resonator B09 is coupled between the series Lamb wave resonator LS and the antenna port ANT in the acoustic wave filter 218. The other acoustic wave resonators B01 to B04 and B06 to B09 can be SAW resonators or BAW resonators.

FIG. 21F is a schematic diagram of an acoustic wave filter 219 that includes a shunt Lamb wave resonator LP and other acoustic wave resonators B01 to B05 and B07 to B09 according to an embodiment.

In the acoustic wave filter 219, a first other series resonator B01 is coupled between the shunt Lamb wave resonator LP and the RF port RF. A second other series resonator B09 is coupled between the shunt Lamb wave resonator LP and the antenna port ANT in the acoustic wave filter 219. The other acoustic wave resonators B01 to B05 and B07 to B09 can be SAW resonators or BAW resonators.

The acoustic wave devices and/or loop circuits discussed herein can be implemented in a variety of packaged modules. Some example packaged modules will now be discussed in which any suitable principles and advantages of the Lamb wave loop circuits discussed herein can be implemented. FIGS. 22A, 22B, 22C, and 22D are schematic block diagrams of illustrative packaged modules according to certain embodiments.

Figure 22A:
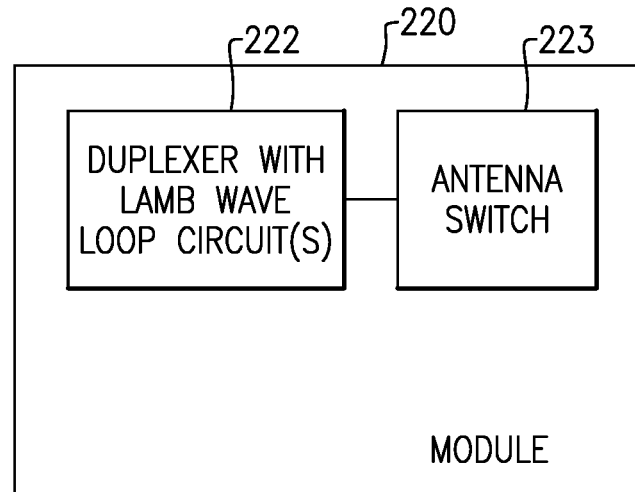
FIG. 22A is a schematic block diagram of a module that includes an antenna switch and a duplexer with a Lamb wave loop circuit according to an embodiment.

FIG. 22A is a schematic block diagram of a module 220 that includes a duplexer 222 with a Lamb wave loop circuit and an antenna switch 223. The module 220 can include a package that encloses the illustrated elements. The duplexer 222 with a Lamb wave loop circuit and the antenna switch 223 can be disposed on a common packaging substrate. The packaging substrate can be a laminate substrate, for example. The duplexer 222 can include a Lamb wave loop circuit in accordance with any suitable principles and advantages discussed herein. The antenna switch 223 can be a multi-throw radio frequency switch. The antenna switch 223 can selectively electrically couple a common node of the duplexer 222 to an antenna port of the module 220.

Figure 22B:
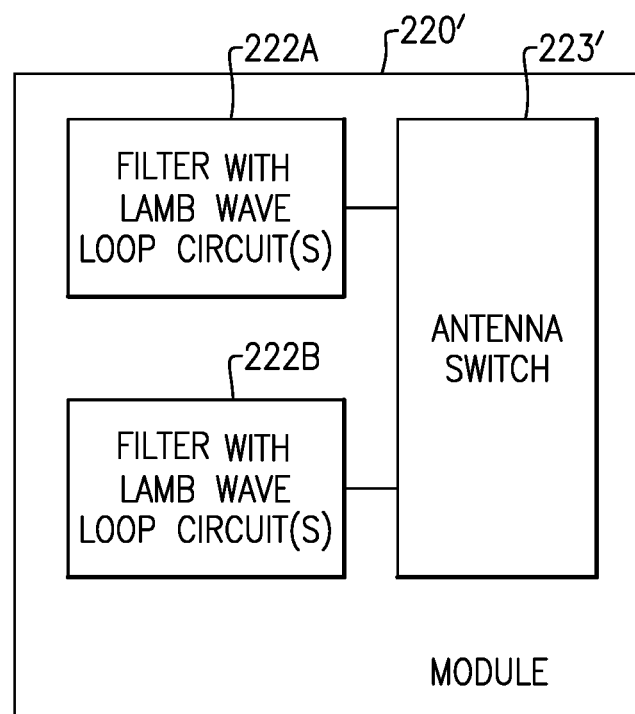
FIG. 22B is a schematic block diagram of a module that includes an antenna switch and a plurality of filters with a Lamb wave loop circuit according to an embodiment.

FIG. 22B is a schematic block diagram of a module 220' that includes a first filter 222A with a Lamb wave loop circuit, a second filter 222B with a Lamb wave loop circuit, and an antenna switch 223'. The module 220' illustrates that two different filters with Lamb wave loop circuits can be included in a module. The first filter 222A with a Lamb wave loop circuit can be implemented on a different die than the second filter 222B with a Lamb wave loop circuit. The antenna switch 223' can selectively electrically couple a port of the first filter 222A and/or the second filter 222B to an antenna port of the module 220'.

Figure 22C:
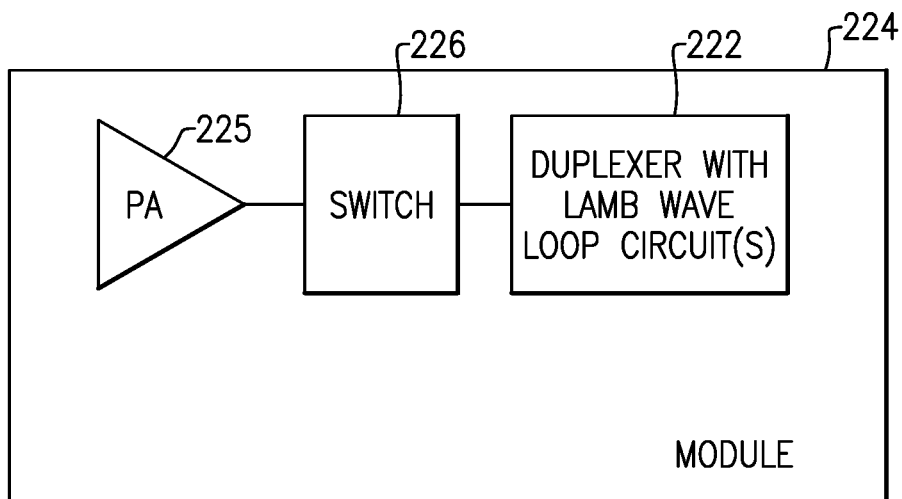
FIG. 22C is a schematic block diagram of a module that includes a power amplifier, a switch, and a duplexer with a Lamb wave loop circuit according to an embodiment.

FIG. 22C is a schematic block diagram of a module 224 that includes a power amplifier 225, a switch 226, and a duplexer 222 with a Lamb wave loop circuit. The power amplifier 225 can amplify a radio frequency signal. The switch 226 can selectively electrically couple an output of the power amplifier 225 to a transmit port of the duplexer 222. The duplexer 222 can include a Lamb wave loop circuit in accordance with any suitable principles and advantages discussed herein.

Figure 22D:
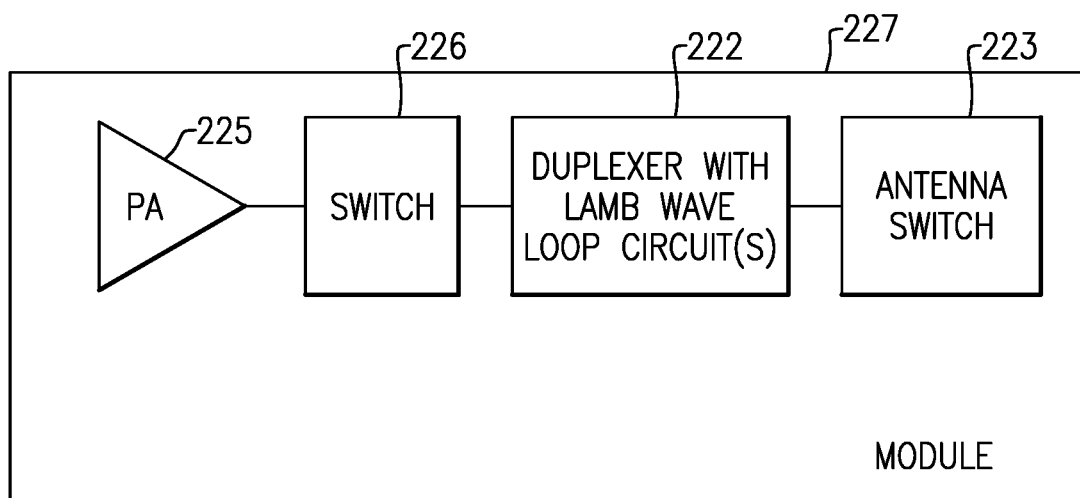
FIG. 22D is a schematic block diagram of a module that includes power amplifier, a switch, a duplexer with a Lamb wave loop circuit, and an antenna switch according to an embodiment.

FIG. 22D is a schematic block diagram of a module 227 that includes power amplifier 225, a switch 226, a duplexer 222 with a Lamb wave loop circuit, and an antenna switch 223. The module 227 is similar to the module 224 of FIG. 22C, except the module 227 additionally includes the antenna switch 223.

Figure 23A:
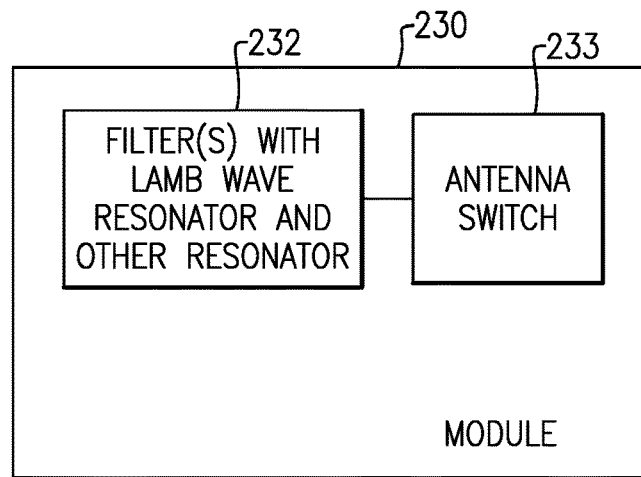
FIG. 23A is a schematic block diagram of a module that includes an antenna switch and one or more filters that include a Lamb wave resonator and another type of acoustic wave resonator according to an embodiment.
Figure 23B:
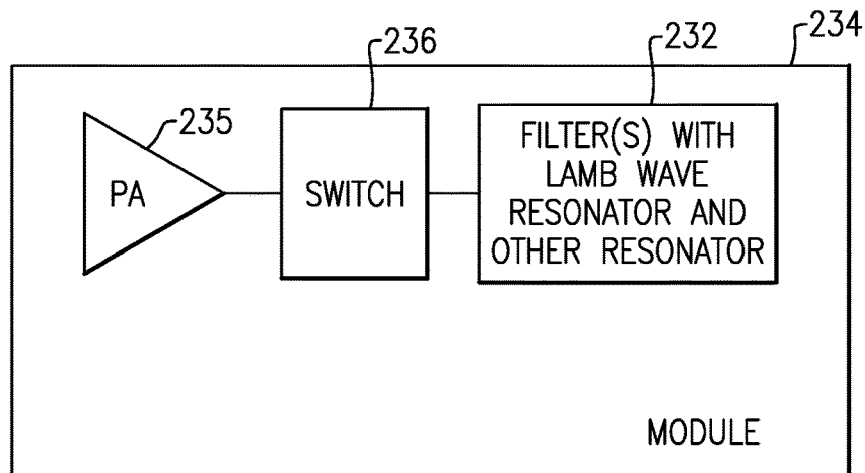
FIG. 23B is a schematic block diagram of a module that includes a power amplifier, a switch, and one or more filters that include a Lamb wave resonator and another type of acoustic wave resonator according to an embodiment.
Figure 23C:
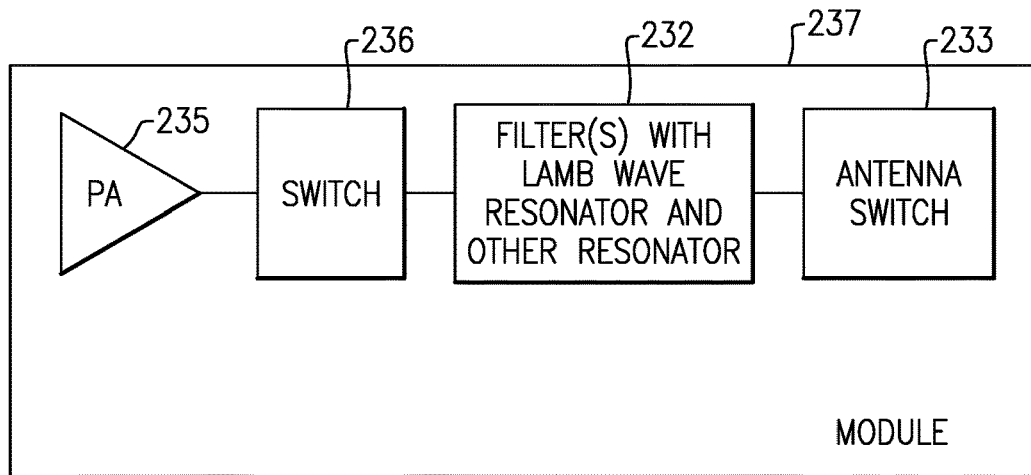
FIG. 23C is a schematic block diagram of a module that includes power amplifier, a switch, one or more filters that include a Lamb wave resonator and another type of acoustic wave resonator, and an antenna switch according to an embodiment.

The acoustic wave filters with a Lamb wave resonator and/or another type of acoustic wave resonator disclosed herein can be implemented in a variety of packaged modules. Some example packaged modules will now be discussed in which any suitable principles and advantages of the acoustic wave filters with a Lamb wave resonator and a different type of acoustic wave resonator discussed herein can be implemented. FIGS. 23A, 23B, and 23C are schematic block diagrams of illustrative packaged modules according to certain embodiments.

FIG. 23A is a schematic block diagram of a module 230 that includes one or more filters 232 with a Lamb wave resonator and another type of acoustic wave resonator. The one or more filters 232 can include any suitable combination of features disclosed in association with FIGS. 20 to 21F. The module 230 can include a package that encloses the illustrated elements. The one or more filters 232 with a Lamb wave resonator and another type of acoustic wave resonator and the antenna switch 233 can be disposed on a common packaging substrate. The packaging substrate can be a laminate substrate, for example. The antenna switch 233 can be a multi-throw radio frequency switch. The antenna switch 233 can selectively electrically couple any suitable number of the one or more of the filters 232 to an antenna port of the module 230.

FIG. 23B is a schematic block diagram of a module 234 that includes a power amplifier 235, a switch 236, and one or more filters 232 with a Lamb wave resonator and another type of acoustic wave resonator. The power amplifier 235 can amplify a radio frequency signal. The switch 236 can selectively electrically couple an output of the power amplifier 235 to a transmit port of the duplexer 232. The one or more filters 232 with a Lamb wave resonator and another type of acoustic wave resonator can be implemented in accordance with any suitable principles and advantages discussed herein.

FIG. 23C is a schematic block diagram of a module 237 that includes power amplifier 235, a switch 236, one or more filters 232 with a Lamb wave resonator and another type of acoustic wave resonator, and an antenna switch 233. The module 237 is similar to the module 234 of FIG. 23B, except the module 237 additionally includes the antenna switch 233.

Figure 24:
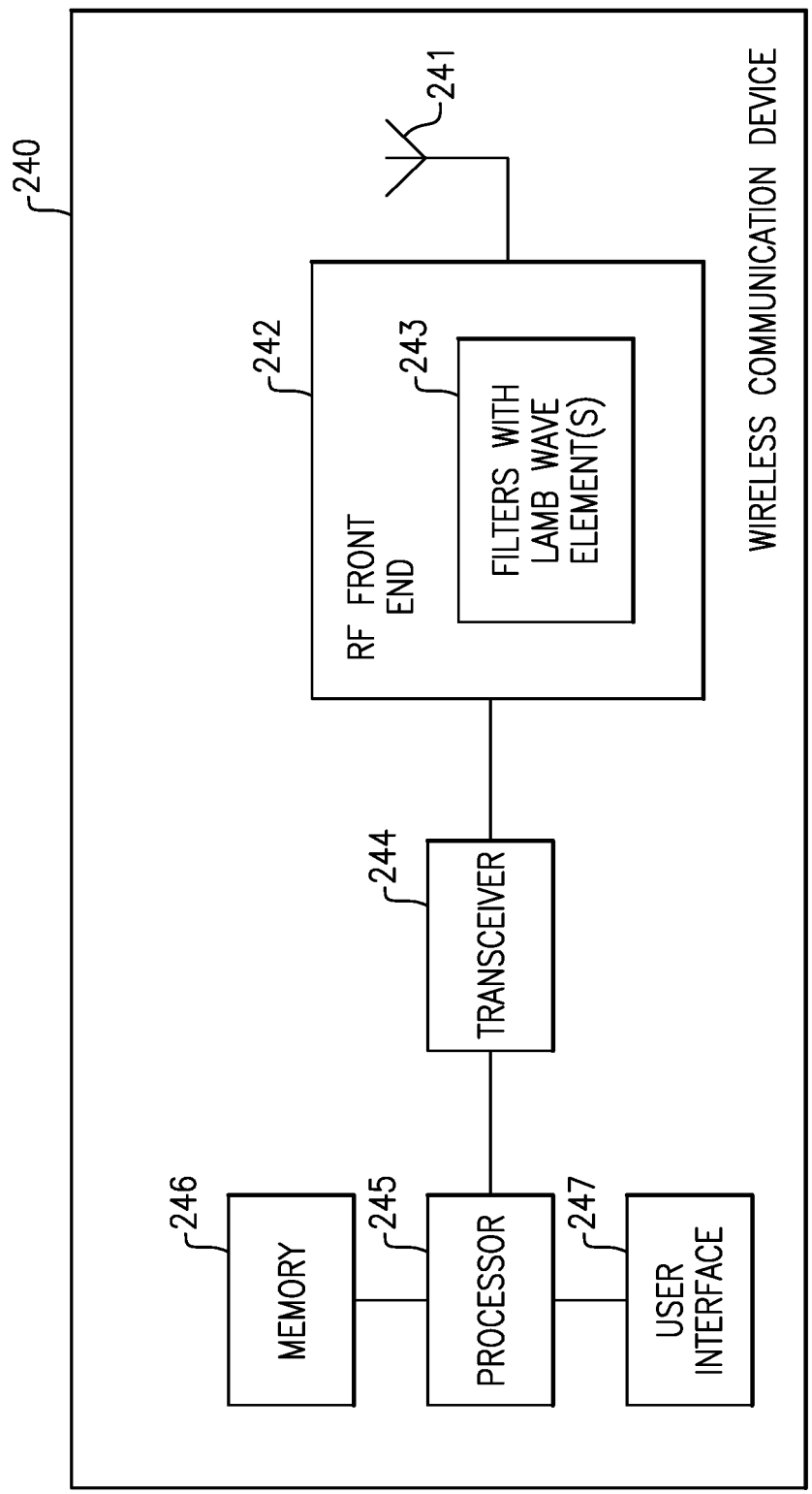
FIG. 24 is a schematic block diagram of a wireless communication device that includes a filter with a lamb wave element according to an embodiment.

FIG. 24 is a schematic block diagram of a wireless communication device 240 that includes filters 243 with one or more Lamb wave elements in accordance with one or more embodiments. For example, the filters 243 can include a duplexer with a Lamb wave loop circuit in accordance with any suitable principles and advantages disclosed herein. The filters 243 can include a first filter with a Lamb wave resonator and a second filter with a different type of acoustic wave resonator, in which the Lamb wave resonator and the different type of acoustic wave resonator are implemented on a common substrate of a die. In certain instances, the filters 243 can include a filter that includes a Lamb wave resonator and a different type of acoustic wave resonator.

The wireless communication device 240 can be any suitable wireless communication device. For instance, a wireless communication device 240 can be a mobile phone, such as a smart phone. As illustrated, the wireless communication device 240 includes an antenna 241, an RF front end 242 that includes the filters 243, an RF transceiver 244, a processor 245, a memory 246, and a user interface. The antenna 241 can transmit RF signals provided by the RF front end 242. The antenna 241 can receive RF signals and provide the received RF signals to the RF front end 242 for processing.

The RF front end 242 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The filters 243 of the RF front end 242 can be implemented in accordance with any suitable principles and advantages disclosed herein. The RF front end 242 can transmit and receive RF signals associated with any suitable communication standards. Any of the acoustic wave devices and/or Lamb wave loop circuits discussed herein can be implemented in the RF front end 242.

The RF transceiver 244 can provide RF signals to the RF front end 242 for amplification and/or other processing. The RF transceiver 244 can also process an RF signal provided by a low noise amplifier of the RF front end 242. The RF transceiver 244 is in communication with the processor 245. The processor 245 can be a baseband processor. The processor 245 can provide any suitable base band processing functions for the wireless communication device 240. The memory 246 can be accessed by the processor 245. The memory 246 can store any suitable data for the wireless communication device 240. The user interface 247 can be any suitable user interface, such as a display with touch screen capabilities.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave filter assembly comprising:
   an acoustic wave filter including a radio frequency port, an antenna port, a Lamb wave resonator, and a second acoustic wave resonator electrically coupled to the Lamb wave resonator, the second acoustic wave resonator being a film bulk acoustic wave resonator, the Lamb wave resonator and the film bulk acoustic wave resonator sharing a cavity, the acoustic wave filter configured to filter a radio frequency signal propagating between the radio frequency port and the antenna port; and
   a loop circuit in parallel with the acoustic wave filter between the radio frequency port and the antenna port, the loop circuit including a Lamb wave element, and the loop circuit configured to generate an anti-phase signal to a target signal at a particular frequency.

2. The acoustic wave filter assembly of claim 1 wherein the Lamb wave resonator and the second acoustic wave resonator are implemented on a common silicon substrate of a die.

3. The acoustic wave filter assembly of claim 2 wherein the cavity is etched into the common silicon substrate.

4. The acoustic wave filter assembly of claim 2 wherein the Lamb wave resonator includes a piezoelectric layer that includes the same material as a piezoelectric layer of the second acoustic wave resonator.

5. The acoustic wave filter assembly of claim 4 wherein the piezoelectric layer of the Lamb wave resonator is an aluminum nitride layer.

6. The acoustic wave filter assembly of claim 1 wherein the loop circuit includes an attenuation element coupled between the Lamb wave element and the antenna port.

7. The acoustic wave filter assembly of claim 6 wherein the loop circuit includes a second attenuation element coupled between the Lamb wave element and the radio frequency port.

8. The acoustic wave filter assembly of claim 6 wherein the attenuation element is a capacitor.

9. The acoustic wave filter assembly of claim 1 wherein the Lamb wave resonator and the second acoustic wave resonator are implemented on a common substrate, and the cavity is over the common substrate.

10. The acoustic wave filter assembly of claim 1 wherein the Lamb wave resonator is a series resonator and the second acoustic wave resonator is a shunt resonator.

11. The acoustic wave filter assembly of claim 1 wherein the Lamb wave resonator is a shunt resonator and the second acoustic wave resonator is a series resonator.

12. The acoustic wave filter assembly of claim 1 further comprising a plurality of additional acoustic wave resonators, the additional acoustic wave resonators being the same type of acoustic wave resonator as the second acoustic wave resonator.

13. The acoustic wave filter assembly of claim 12 wherein the acoustic wave filter includes a first number of acoustic wave resonators that are the same type of acoustic wave resonator as the second acoustic wave resonator, the first number being at least twice as many as a second number of one or more Lamb wave resonators of the acoustic wave filter.

14. A wireless communication device comprising:
    an acoustic wave filter configured to filter a radio frequency signal, the acoustic wave filter including a Lamb wave resonator and a film bulk acoustic wave resonator, the Lamb wave resonator and the film bulk acoustic wave resonator being implemented on a common substrate, and the film bulk acoustic wave resonator and the Lamb wave resonator sharing a cavity;
    a second acoustic wave filter, the second acoustic wave filter coupled to the acoustic wave filter at a common node of a multiplexer;
    a loop circuit including a Lamb wave element and an attenuation element, the Lamb wave element coupled to the acoustic wave filter by way of the attenuation element; and
    an antenna in communication with the acoustic wave filter.

15. The wireless communication device of claim 14 wherein the Lamb wave resonator includes a piezoelectric layer that includes the same material as a piezoelectric layer of the film bulk acoustic wave resonator.

16. The wireless communication device of claim 14 wherein the loop circuit is coupled in parallel with the acoustic wave filter.

17. The wireless communication device of claim 14 wherein the loop circuit is coupled across the acoustic wave filter and the second acoustic wave filter.

18. An acoustic wave filter assembly comprising:
    a first acoustic wave filter configured to filter a first radio frequency signal, the first acoustic wave filter including a Lamb wave resonator implemented on a substrate of a die;
    a second acoustic wave filter configured to filter a second radio frequency signal, the second acoustic wave filter including a film bulk acoustic wave resonator implemented on the same substrate of the die as the Lamb wave resonator, the film bulk acoustic wave resonator and the Lamb wave resonator sharing a cavity, the first acoustic wave filter and the second acoustic wave filter coupled together at a common node of a multiplexer; and
    a loop circuit including a Lamb wave element and an attenuation element, the loop circuit coupled to the second acoustic wave filter by way of the attenuation element, and the loop circuit and configured to improve isolation associated with the multiplexer.

19. The acoustic wave filter assembly of claim 18 wherein the loop circuit is coupled in parallel with the second acoustic wave filter.

20. The acoustic wave filter assembly of claim 18 wherein the Lamb wave resonator includes a piezoelectric layer that includes the same material as a piezoelectric layer of the film bulk acoustic wave resonator.

21. The acoustic wave filter assembly of claim 18 wherein the multiplexer is a duplexer.

22. The acoustic wave filter assembly of claim 18 wherein the attenuation element is a capacitor.

* * * * *